US006979934B1

(12) United States Patent
Wischnewskiy

(10) Patent No.: US 6,979,934 B1
(45) Date of Patent: Dec. 27, 2005

(54) PIEZOELECTRIC DRIVE, ESPECIALLY A HOLDING FRAME, A FRICTION ELEMENT AND A CIRCUIT CONFIGURATION

(75) Inventor: Wladimir Wischnewskiy, Waldbronn (DE)

(73) Assignee: PI Ceramic GmbH, Lederhose (DE)

( * ) Notice: Subject to any disclaimer, the term of this patent is extended or adjusted under 35 U.S.C. 154(b) by 134 days.

(21) Appl. No.: 10/019,440

(22) PCT Filed: Jun. 30, 2000

(86) PCT No.: PCT/EP00/06133

§ 371 (c)(1),
(2), (4) Date: Aug. 17, 2002

(87) PCT Pub. No.: WO01/03282

PCT Pub. Date: Jan. 11, 2001

(30) Foreign Application Priority Data

Jun. 30, 1999 (DE) .......................... 199 45 042

(51) Int. Cl.[7] .............................................. H02N 2/12
(52) U.S. Cl. .................................. 310/323.01; 310/328
(58) Field of Search ........................... 310/323.01, 328, 310/348

(56) References Cited

U.S. PATENT DOCUMENTS

| 5,166,572 | A | | 11/1992 | Ohnishi ................ 310/323.16 |
| 5,714,833 | A | | 2/1998 | Zumeris ...................... 310/328 |
| 5,877,579 | A | * | 3/1999 | Zumeris ................ 310/323.01 |
| 6,384,515 | B1 | * | 5/2002 | Ganor et al. ................ 310/328 |

FOREIGN PATENT DOCUMENTS

| DE | 196 48 726 | 5/1998 | ............. B06B/1/06 |

OTHER PUBLICATIONS

S. Ben-Yaakov et al.: "A resonant driver for a piezoelectric motor" Proceedings of the Thirty-Ninth International Power Conversion Conference PCIM'99, Nurnberg, Germany Jun. 22, 1999–Jun. 24, 1999.

* cited by examiner

Primary Examiner—Thomas M. Dougherty
(74) Attorney, Agent, or Firm—Oblon, Spivak, McClelland, Maier & Neustadt, P.C.

(57) ABSTRACT

A piezoelectric drive, especially a piezoelectric motor for producing continuous or stepwise movements, a friction element for such a piezoelectric drive as well as for transmission of forces between stator and rotor, and a circuit arrangement for operating a piezoelectric drive, especially a piezoelectric motor. An elastic double frame enclosing the transducer and having inner and outer frames is disposed at each outer node of the bending oscillation mode to hold the piezoelectric transducer and produce the pressing force of the friction element. The inner frame is joined to each of the longitudinal narrow sides of the transducer and the outer frame to the outer fastening. Further, the outer frame and inner frame are spaced apart and maintained in contact by stays or bridges. The friction element is constructed as a double-layer structure with a first hard, porous member joined to the transducer, and with a second part or member including an abrasion-resistant monolithic material maintained in contact with the rotor, the two layers being bonded by sintering. The circuit arrangement for operation of the drive relies on a special bridge power amplifier as well as on the capability of compensating for temperature variation of the drive for stable operation thereof.

5 Claims, 16 Drawing Sheets

PIEZOELECTRIC DRIVE, ESPECIALLY A HOLDING FRAME, A FRICTION ELEMENT AND A CIRCUIT CONFIGURATION

The invention relates to a piezoelectric drive, especially a piezoelectric motor for producing continuous or stepwise movements, comprising a rotor provided with a friction surface, a drive element in the form of a piezoelectric exciter that can be brought into contact with this surface, the exciter comprising a monolithic, plate-like, piezoelectric transducer provided with substantially rectangular electrode faces, an outer fastening, a friction element disposed on one of the end faces of the piezoelectric transducer, as well as a holding device for the piezoelectric transducer and means for pressing the friction element elastically against the friction surface of the rotor. The invention also relates to a friction element for a piezoelectric drive for transmitting forces between stator and rotor as well as to a circuit arrangement for operating a piezoelectric drive, especially a piezoelectric motor.

Piezoelectric motors which comprise a stator and rotor and wherein the stator is provided with at least one piezoelectric oscillator that can be pressed frictionally against the surface of the rotor in drive direction are known. The oscillator comprises in known manner a piezo element provided on its parallel outside faces with electrodes, which are connected to an a.c. voltage source. An example of the prior art can be found in German Patent 2530045 C2.

From European Patent Application 0475752 there are known linear piezoelectric motors which rely functionally on acoustic traveling waves. As is also shown in U.S. Pat. No. 5,596,241, such motors have the disadvantage that they cannot be miniaturized, since the minimum length of the waveguide must be an integral multiple of the wavelength $\lambda$. Furthermore, such motors are structurally complex, technologically difficult to reduce to practice and therefore expensive.

Piezoelectric motors based on standing waves are also known in the prior art, as evidenced by U.S. Pat. No. 5,714,833. In such motors a piezoelectric exciter tuned to the second bending mode and the first longitudinal mode of the acoustic oscillations is used as the drive element. The exciter is provided with a plate-like piezoelectric piezotransducer, which is equipped with two electrode groups for generation of oscillations and on the end face of which there is disposed a friction element. Transverse displacement of the exciter is limited by means of a special holding device. The friction surface of the exciter is pressed elastically against the corresponding friction surface of the rotor by means of a pressing component, such as a spring.

As shown in U.S. Pat. No. 5,714,833, the component for producing the pressing force of the exciter and the transverse holding device of the exciter are constructed as mutually separate subassemblies. The known transverse holding device has the form of two rigid and two elastic carriers, which are disposed on the sides of the piezotransducer. The elastic carriers press the piezotransducer against the rigid carriers, such as studs disposed in a cavity of the piezotransducer, thus achieving appropriate fixation in transverse direction. The rigid carriers are constructed, for example, as conical plastic elements or plastic pins, the elastic carriers being made of rubber-like materials. The actual component for pressing the exciter or a friction element against the rotor surface comprises a spring braced by a rear housing wall against the second end surface of the piezotransducer.

In the teaching of the solution known from U.S. Pat. No. 5,714,833 described hereinabove, it is a substantial disadvantage that the two carrier types, the holding device and the pressing component of the exciter have poor mechanical quality and a high coefficient of friction with the surface of the piezotransducer. As a result of these facts, undesired heating occurs during operation of a motor constructed in this way, due both to the internal friction of the element and to friction at the surfaces of the oscillating transducer. Undesired heating of the piezotransducer not only reduces the efficiency of the motor but also leads to unstable operation.

A further substantial disadvantage of the known solution, which comprises a carrier made of plastic materials and rubber-like materials, is the unilateral, rigid fastening, which does not permit precise positioning, especially at high rotor velocities. In such motors it has been observed that strong unilateral runout of the rotor occurs, reaching several tenths of one micrometer, which is unacceptably large for many applications. Thus the drive cannot be regarded as a precision drive. Ultimately the transverse holding device and the pressing component put mechanical stress on the exciter, thus adding a further active resistance to its resonance system. This in turn necessitates an increase of the exciter voltage to 500 V, in turn entailing special protective measures. Furthermore, the frequency range of optimal motor operation as regards the mechanical resonance frequency of the bending mode of the oscillator vibrations shifts on the frequency scale, and so frequency stabilization of the working point by means of phase feedback becomes impossible.

From German Patent 19648726 A1 there is known a piezoelectric drive element with at least one oscillator comprising piezoelectric ceramic or attached piezoelectric exciters that is movable in x-, y- or z-direction, the at least one oscillator being fastened to an oscillator holder. According to the solution therein, the oscillator holder is fastened by means of spring bearings, especially bending spring linkages, to a carrier part in such a way that the movement of the at least one oscillator or of the oscillator holder in the y- and z-direction can be suppressed, while the desired movement in the x-direction can take place with the least possible perturbation. According to German Patent 19648726 A1, the oscillator holder, bending spring linkages and carrier part are constructed in one piece as a monolithic subassembly. It has been shown, however, that the arrangement cited hereinabove for a piezoelectric drive element tends to material fatigue during prolonged operation due to the forces acting in the region of the bending spring linkages and that a permanent predetermined brake point exists in the transition region between oscillator holder and bending spring linkage.

From the foregoing, one object of the invention is to provide a further-developed piezoelectric drive, especially a piezoelectric motor for production of continuous or stepwise movements, wherein the efficiency and long-term stability of the drive are improved by a special holding device such that precise translational movements and fine positioning adjustments, such as for microscope or coordinate tables, can be achieved under all circumstances. Another object of the invention is to prevent undesired heating of the exciter, so that motor operation can be stabilized.

A further object of the invention is to improve the friction elements known in themselves for a piezoelectric drive for transmission of forces between stator and rotor to the effect that, on the one hand, the friction element is joined in firmly adhering manner to the piezo oscillator or exciter and, on the other hand, the outer contact surface satisfies all requirements of wear resistance and reliable driving of the rotor.

Ultimately it is the object of the invention to provide a circuit arrangement for operation of a piezoelectric drive, especially a piezoelectric motor, by means of which the working point of the motor can be stabilized while at the same time the exciter voltage remains low.

The object of the invention is achieved with subject matter according to the features of claim 1 as it relates to the piezoelectric drive and the special holding device of the piezoelectric transducer, with a double-layer structure according to the definition of claim 6 as it relates to the improved friction element, and with a teaching according to the features of claim 11 as it relates to the circuit arrangement for operation of a piezoelectric drive, the dependent claims respectively comprising at least expedient embodiments and improvements.

The basic idea of the invention with respect to the piezoelectric drive and the holding device necessary therefor is that it be designed such that the actual transverse holding device of the piezoelectric transducer or oscillator is combined with the function of elastic pressing of the friction element against the rotor surface.

Specifically, an elastic double frame enclosing the transducer and having inner and outer frames is disposed at each outer node of the bending oscillation mode for the purpose of holding the piezoelectric transducer and for producing the desired pressing force of the friction element.

The inner frame is joined to each of the longitudinal narrow sides of the transducer and the outer frame to the outer fastening.

The outer and inner frames are spaced apart from one another and are maintained in contact via stays or bridges. The double frames are made of high-quality elastic material.

Preferably the double frames respectively have a structure that is symmetric along the axes, while the stays or bridges joining the inner and outer frames are centrally disposed.

Since, as described hereinabove, each inner frame is joined rigidly with its narrow sides to the longitudinal narrow sides, or in other words the smaller side faces of the plate-like piezoelectric transducer, and each outer frame is joined rigidly to the outer fastening, such as a housing, and since bridging structures are present between inner and outer frames, each of the two double frames becomes a high-quality bending-oscillation element. In the proposed construction, no mutual movements exist between the vibrating or oscillating surfaces of the piezoelectric exciter and the inner-frame surfaces joined rigidly thereto, and so no mechanical friction losses occur.

The internal friction losses of the double frames themselves are extremely small, since the frames are made from materials of high mechanical quality. The transverse holding device of the piezoelectric exciter and the fixture combined therewith for elastic pressing of the exciter or the friction element disposed thereon exhibits very small mechanical losses. Together with the double-frame holding devices, the exciter, or in other words the oscillator forms a common oscillating system having small mechanical losses. The carrier does not become heated and thus has a great degree of stability during operation. By virtue of the much smaller mechanical losses, the efficiency of the motor is greater than that of known solutions, and smaller exciting voltages are possible.

Ultimately the inner and outer frames have great rigidity in their transverse directions, and so transverse displacements of the exciter during positioning of the rotor with high velocity can be ruled out, meaning in principle that positioning precision equal to the smallest oscillation step of the exciter is possible.

To maintain the desired properties of the exciter or oscillator in combination with its holding device, spacing gaps are provided between the longitudinal broad sides of the transducer and the respective inner frames. Preferably the inner frames are connected by continuous material to the longitudinal narrow sides of the transducer, by adhesive bonding, soldering or similar types of joining.

As regards the friction element for a piezoelectric drive for transmission of forces between stator and rotor, a further basic idea of the invention relies on a double-layer structure.

The part of the layer structure joined to the transducer or exciter is formed as a hard, porous member, while the part of the layer structure maintained in contact with the rotors comprises an abrasion-resistant monolithic member. The two layers or the two members are joined to one another by sintering. Fillers for maintaining a firm bond between the transducer surface and the actual friction element are disposed on or introduced into the pores of the part of the layer structure joined to the transducer.

Examples of usable fillers are epoxy resin and/or low melting glasses. Preferably the interface of the double-layer structure is oriented substantially parallel to the end face of the transducer.

The friction element with double-layer structure can be constructed either as a square or even as a flat or steep truncated pyramid or conical member. In an embodiment fashioned as a truncated pyramid, the joining surface between friction element and exciter is enlarged, so that the adhesion achieved here can be increased and greater forces can be transmitted.

The circuit arrangement for operation of a piezoelectric drive, especially a piezoelectric motor, is in principle a primary or control generator that cooperates with a two-channel bridge power amplifier. A first output of the power amplifier is connected directly to the output of the primary or control generator, while the second output is connected to the primary generator via a phase shifter. A filter as well as a summing transformer is looped into the output diagonals of the bridge power amplifier, the secondary winding of the transformer being contacted via a changeover switch with one of the electrode faces, known in themselves, of the piezoelectric transducer. Linear velocity regulation of the drive or of the motor operation can be achieved with such a circuit arrangement.

In a further embodiment of the circuit arrangement for operation of a piezoelectric drive, there are additionally provided a signal-level transducer, a comparator and an electronic electrode-group commutator. In this case the input of the signal-level transducer is connected to the comparator input and the output of the signal-level transducer is connected to the phase-control input of the phase shifter. The comparator outputs are connected to the control inputs of the electrode-group commutator, while the outputs of the commutator are connected to the respective electrode faces. In this embodiment, activation of the motor can be achieved in unipolar operation.

In a further embodiment of the invention, a bending sensor for measurement of the bending components of the mechanical excitation is disposed on the piezoelectric transducer or exciter, the bending sensor being formed as a thin, one-layer piezoceramic plate. The piezoceramic plate of the bending sensor has bidirectional polarization, which is perpendicular and symmetric relative to its transverse axis. The plate itself is fastened rigidly to the surface of the piezoelectric transducer, preferably midway between the center and side nodes of the bending mode of the oscillations.

In this embodiment, it is possible to obtain a measured signal whose phase shift is directly proportional to the change of the mechanical bending stresses or to the velocity of oscillation of the exciter.

In this embodiment of the piezoelectric motor with bending sensor, a phase detector with a reference-signal input, a control input and an output is provided in the circuit arrangement. The primary generator has an input for electrical control of the excitation frequency. One of the groups of electrode faces of the transducer is connected to the reference-signal input of the phase detector via a reference-signal generating device. The bending-sensor electrodes are connected to the input of the reference-signal generator, whose output is contacted with the control input of the phase detector. The output of the phase detector in turn is connected to the input for activation of the excitation frequency of the primary generator.

In this alternative embodiment of the circuit, there is provided negative frequency feedback, whereby stabilization of the motor operation is made possible in a broad temperature range.

The invention will be explained in more detail hereinafter on the basis of practical examples and with reference to figures, wherein.

Figure 1:
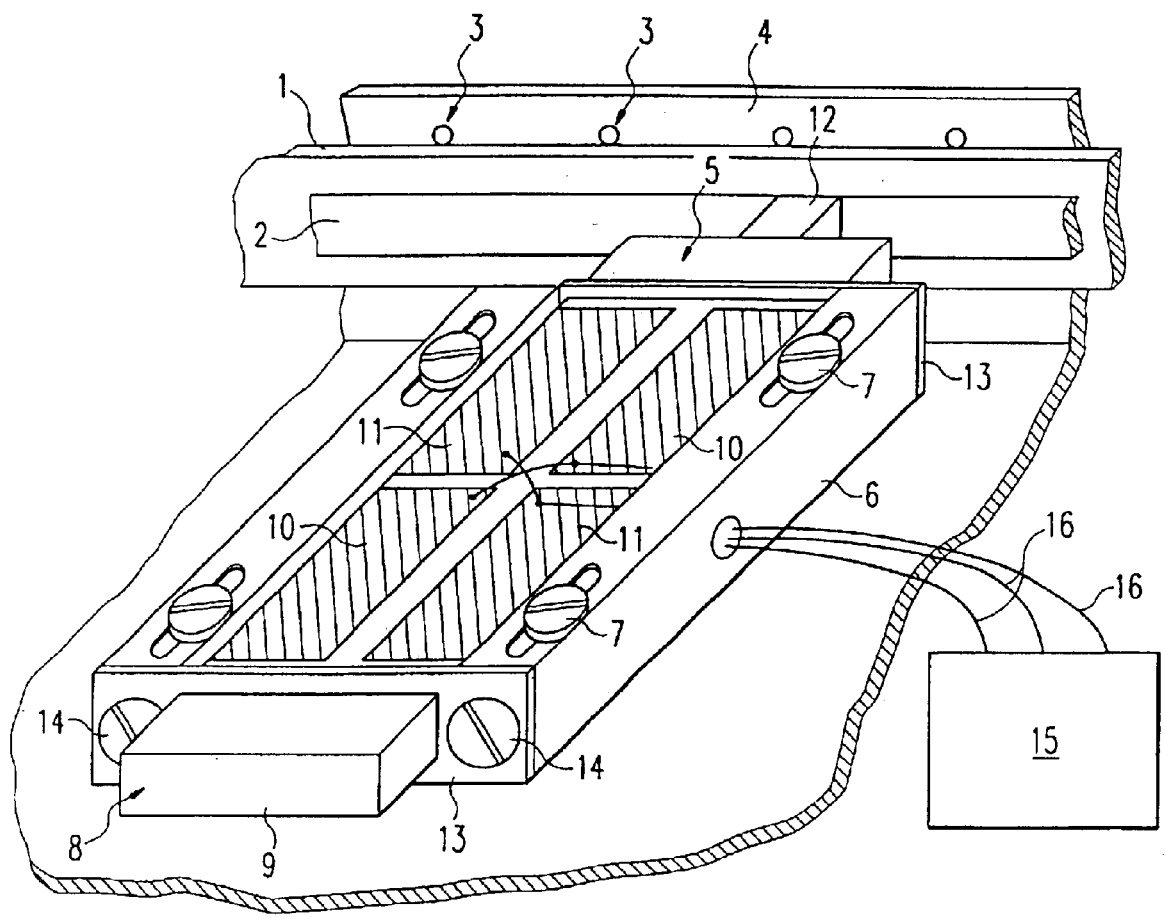
FIG. 1 shows a block diagram of the piezoelectric drive in an embodiment as a linear motor.

The piezoelectric drive illustrated in an embodiment as a linear motor in FIG. 1 comprises a rotor with a friction surface and a drive element or a corresponding drive unit that can be brought into contact with this surface. The drive element is designed in the form of a piezoelectric exciter, the exciter comprising in a manner known in itself a monolithic, plate-like piezoelectric transducer with substantially rectangular electrode faces. An outer fastening, which can also be part of a housing, is also provided.

A friction element is disposed on one of the end faces of the piezoelectric transducer, and there is provided for the piezoelectric transducer a special holding device, which simultaneously permits the friction element to be pressed elastically against the friction surface of the rotor. To hold the piezoelectric transducer and to produce the pressing force of the friction element, an elastic double frame with inner and outer frames, enclosing the transducer, is disposed respectively at the outer nodes of the bending-oscillation mode.

The inner frame is joined respectively to the longitudinal narrow sides of the transducer, and the outer frame is joined to the outer fastening, which can be part of a housing. The outer frame and the inner frame are spaced apart and are in contact via stays or bridges. The double frame is of one-piece construction and can be made from a metallic material by electroerosion, etching, laser cutting or similar techniques.

According to FIG. 1 there is provided a rotor 1, which has a friction surface 2. Rotor 1 is braced via bearings 3 against a carrier base 4.

A drive element 5 is joined in active elastic relationship to rotor 1. Drive element 5 is held in a housing 6.

In the illustrated example, housing 6 is fastened positively and nonpositively to carrier base 4 by means of screws. Oblong holes in housing 6 permit adjustment of the position of the housing and thus of drive element 5 relative to rotor 1.

Drive element 5 is constructed as a piezoelectric exciter 8, which contains a monolithic, plate-like piezoelectric transducer 9 as well as two electrode faces or electrode groups and a friction element 12 disposed on end surface 9.

The transverse fastening of piezoelectric transducer 9 and the pressing of friction element 12 against the friction surface 2 of rotor 1 is ensured by means of special double frames 13. These elastic double frames 13 enclose plate-like piezoelectric transducer 9 at both ends, in each case at the outer nodes of the bending-oscillation mode.

Each of the electrode groups or electrode faces 10, 11 is connected via appropriate terminal leads 16 to a circuit arrangement for activation.

On their outer side the double frames are detachably joined to the corresponding part of housing 6 by means of screws 14.

Figure 2:
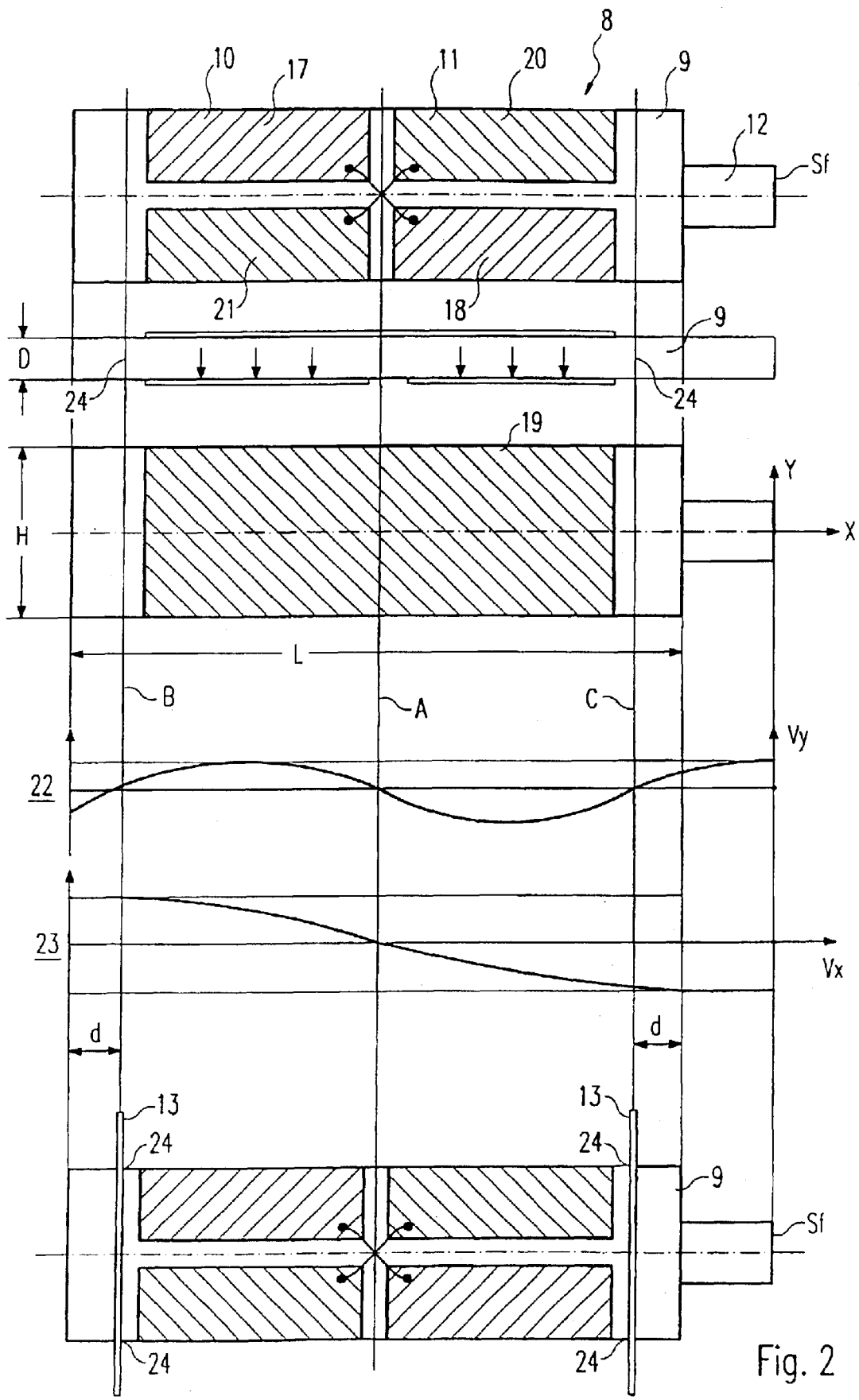
FIG. 2 shows a diagram of the basic construction of the piezoelectric transducer or oscillator.

The basic construction of piezoelectric exciter 8 is illustrated in FIG. 2. Exciter 8 contains the monolithic, plate-like, piezoelectric transducer 9 with friction element 12. On the larger side faces of transducer 9 there are disposed flat electrodes, which are interconnected in groups 10, 11. Electrode group 10 is formed by the two upper electrodes 17 and 18 and one lower electrode 19 or rear-side electrode. Electrode group 11 comprises the oppositely disposed upper electrodes 20 and 21 as well as the lower or rear-side electrode 19. Electrodes 17, 21 as well as 18, 20 are constructed symmetrically relative to the longitudinal axis of plate-like piezoelectric transducer 9. Furthermore, electrodes 17 and 18 as well as 20 and 21 according to FIG. 2 are electrically interconnected diagonally in pairs. The piezoceramic disposed between the front-side and rear-side electrodes is polarized homogeneously and perpendicular to the electrode surfaces according to FIG. 2.

In the practical example, the length and width of piezoelectric transducer 9 are so selected that their ratio is about 3.7. This means that piezoelectric transducer 9 is tuned to the second bending oscillation mode and the first longitudinal oscillation mode. The resonance frequencies of these oscillation modes are close to one another. For such a relationship between the resonance frequencies, the distribution of oscillation velocities for bending oscillations Vy and for longitudinal oscillations Vx varies along the centerline as shown in diagrams 22 and 23 of FIG. 2.

Over the length L of the plate-like piezotransducer there exist three nodes of the oscillation velocity of the bending mode of the oscillations in which the transverse component of the oscillation velocity Vy is equal to zero. The middle nodes are located on line A at the center of plate-like transducer 9, while two outer nodes are located along lines B and C.

Elastic double frames 13, or in other words the inner frame part, are fastened at points 24 of the longitudinal narrow sides of plate-like piezoelectric transducer 9, which points simultaneously correspond to the outer nodes. These points are disposed on lines B and C, and are separated from the outer end surfaces of piezotransducer 9 by distance d. Distance d corresponds approximately to 1/9 to 1/11 L, the exact value being experimentally determinable.

Figure 3:
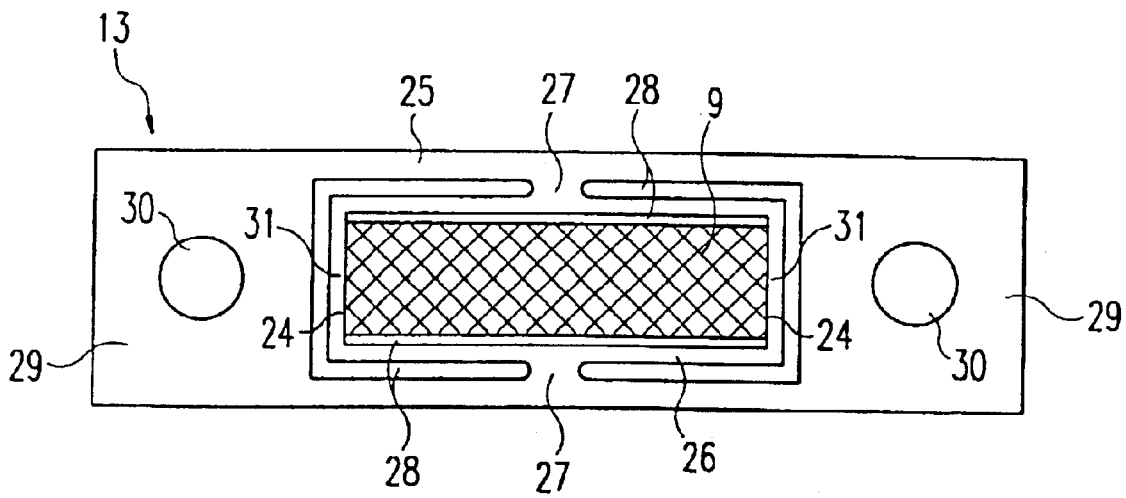
FIGS. 3 and 4 show a diagram of the construction of the double frames in side view and top view respectively.
Figure 4:
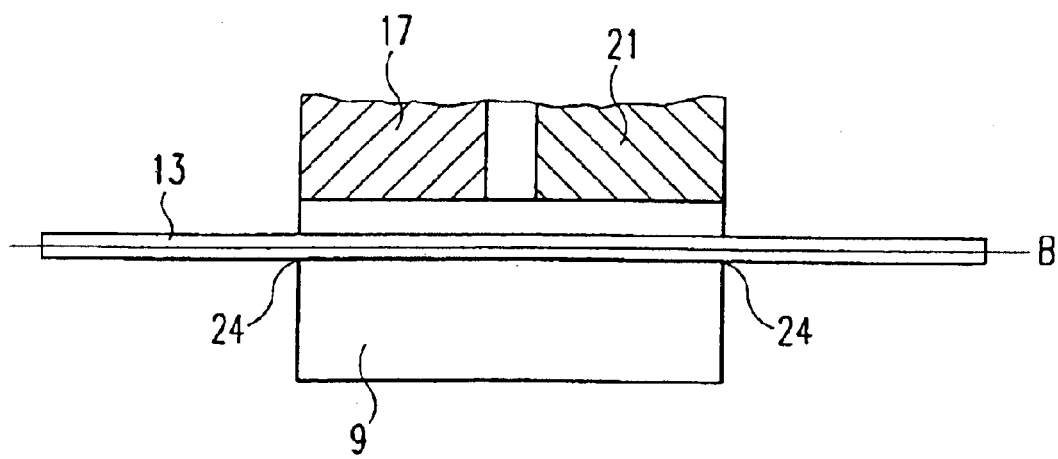

Particulars of the construction of flat elastic double frames 13 are shown in FIGS. 3 and 4. Each double frame 13 comprises an outer frame 25 and an inner frame 26. Outer and inner frames are separated by a gap and can move oscillatingly relative to one another. Outer frame 25 is joined to inner frame 26 by means of two centrally disposed bridges or stays 27. Between the two frames 25 and 26, and between inner frame 26 and the larger of the side surfaces of plate-like piezoelectric transducer 9, there exist the already mentioned gaps 28. Outer frame 25 is provided on both of its lateral faces 29 with bores or similar openings 30, which are used for fastening frame 13 to housing 6, for example by means of screws 14 (FIG. 1).

Flat elastic double frames 13 are preferably made of heat-treated beryllium bronze with a thickness of 0.1 to 0.5 mm or from a corresponding steel strip by means of laser cutting or chemical etching. The gaps between the frames are made in the same technological manufacturing cycle. The gap thickness ranges between 0.1 and 0.2 mm. The gaps 28 disposed between inner frame 26 and the larger sides of plate-like transducer 9 can range between 0.05 and 0.1 mm.

Inner frame 26, together with its lateral parts 31, is fastened rigidly, and in particular is joined by continuous material to the respective longitudinal narrow sides, or in other words the smaller side faces of plate-like transducer 9. The points in question are denoted by reference symbols 24 according to FIG. 4.

Figure 5:
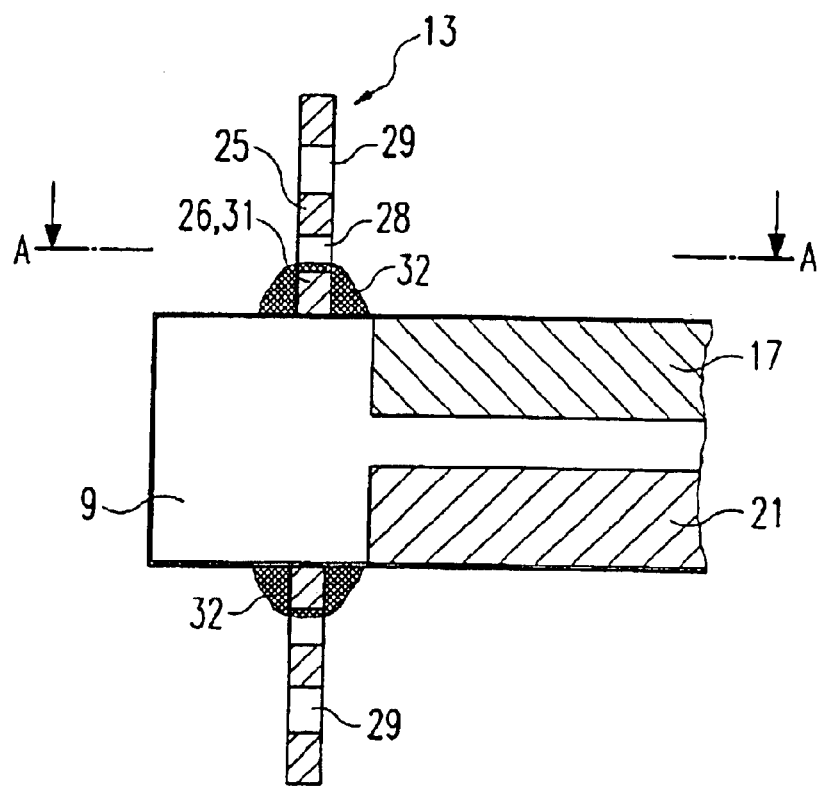
FIGS. 5 and 6 show a diagram of the joint between the inner frame of the double-frame arrangement and the plate-like piezoelectric transducer.
Figure 6:
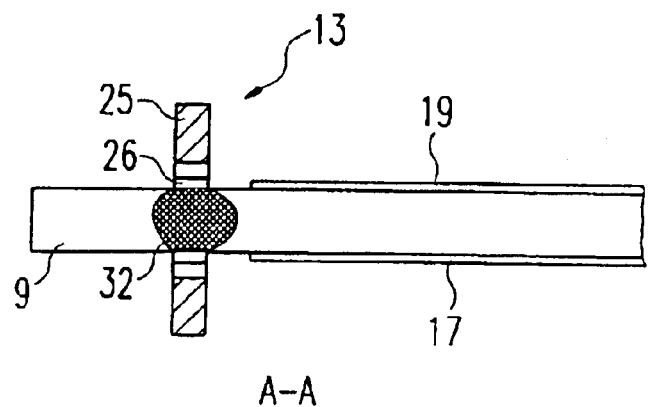

The rigid fastening of the sides of inner frame 26 to the smaller side faces of plate-like piezotransducer 9 can be accomplished by adhesive bonding, wherein a drop 32 of epoxy resin (see FIGS. 5 and 6) is applied directly onto the piezoceramic surface.

Alternatively a soldered joint can be made, in which case the sides of frame 26 are soldered by means of a soft solder to the metal intermediate layers applied beforehand on the piezoceramic. The metal intermediate layer can be applied on the surface of piezotransducer 9 at the appropriate points 24 by vacuum coating. Conceivable multi-layer structures are those of the chromium-copper-nickel or titanium-copper-nickel or similar types, which have good solderability and optimized bonding to the surface of the piezoceramic.

Figure 7:
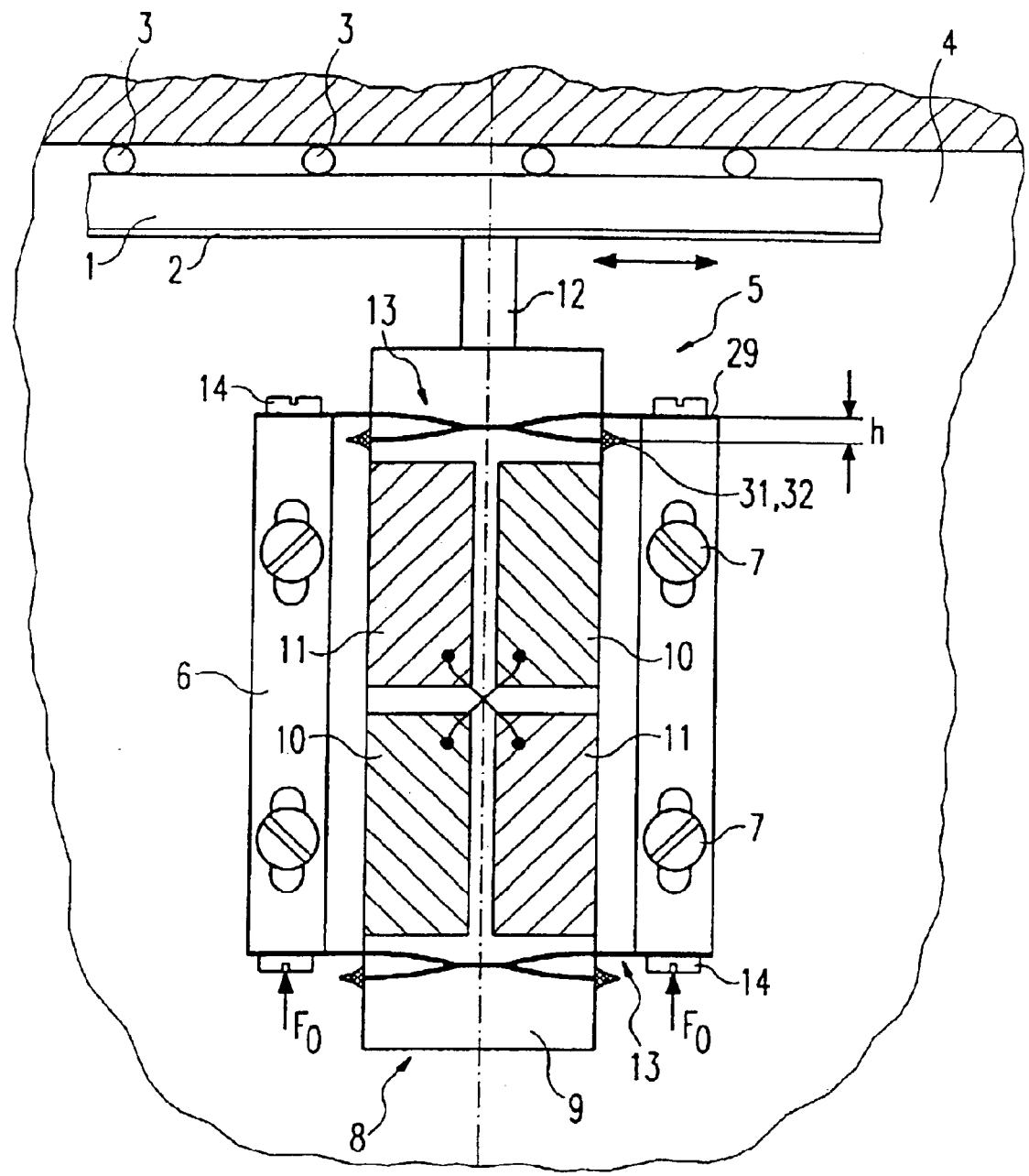
FIG. 7 shows a top view of the motor construction in the embodiment as a linear drive.

FIG. 7 shows a top view of a ready-to-use piezoelectric linear drive with an enlarged diagram of the quasi x-shaped deformation of double frames 13, the sides 29, 31 of the inner and outer frames being bent to a degree h in this case. The forces acting on double frames 13 or generated there will be explained in more detail with reference to FIG. 8.

During assembly of the piezoelectric drive, two secondary forces F0 (see FIG. 7) acting along the X-axis and disposed perpendicular to friction surface 2 of rotor 1 are produced. Friction element 12 is then braced on friction surface 2, and double frames 13 are pulled apart to the distances h. The distances h are determined by the elasticity of double frames 13 and resultant force 2F0. Force 2F0 is adjusted to be equal to the force Fp which presses friction element 12 against friction surface 1. Thereafter housing 6 is fastened to the base or to carrier 4 by means of screws 7. As a result, two elasticity forces FS acting at the angle $\alpha f$ relative to the smaller side faces of plate-like piezotransducer 9 are developed in elastic double frames 13, as is evident from FIG. 8.

Secondary forces F0 are canceled after housing 6 has been fastened.

Points 24, at which double frames 13 are fastened to the smaller side faces of plate-like piezotransducer 9, function as the point of application of elasticity forces FS. Each of the elasticity forces FS is resolved into two components at points 24. One component is directed along the side face, and is denoted by F1. The second component is oriented perpendicular thereto and is denoted by Ft. The forces FS, F1 and Ft form the triangle of forces clearly shown in diagram 33.

Forces F1 are oriented in the direction of friction surface 2 of rotor 1. They press friction element 12 against friction surface 2, and so pressing force Fp is formed by the sum of the four forces F1.

In addition, forces F1 tend to shift transducer 9 relative to side face 29 of the double frames. Forces Ft are oriented opposite to one another and compress plate-like piezotransducer, thus counteracting forces F1 and fixing the transducer.

Relative to force F1, force Ft has a magnitude of about $Ft=(F1 \times H)/h$. If, for example, the plate-like piezotransducer has dimensions of 37×10×3 mm and the friction element has dimensions of 3×3×4 mm, static pressing force Fp is about 10 N. If the double frames have a thickness of 0.3 mm and dimensions of 22×6 mm, the force of 10 N is developed when double frames 13 have been pulled apart to the distance of about h=0.5 mm.

This means that, for a pressing force Fp of 10 N, the two elasticity forces FS form a compressive force of Ft=12.5 N, starting from middle frame 13.

For one side on double frame 13, the ratio Ft/F1 is equal to 3.125. This means that, with the proposed fixture and holding device for transverse fastening and for pressing the exciter under the influence of the static pressing force Fp, there results a static compressive force Ft which is directed perpendicular to the side faces of plate-like piezotransducer 9 and which is substantially larger than the displacement force F1. Such quasi force transformation acts to achieve good and secure joining of the spring arrangement of the double frames to piezotransducer 9, without leading to development of highly stressed and thus predetermined break points.

Figure 8:
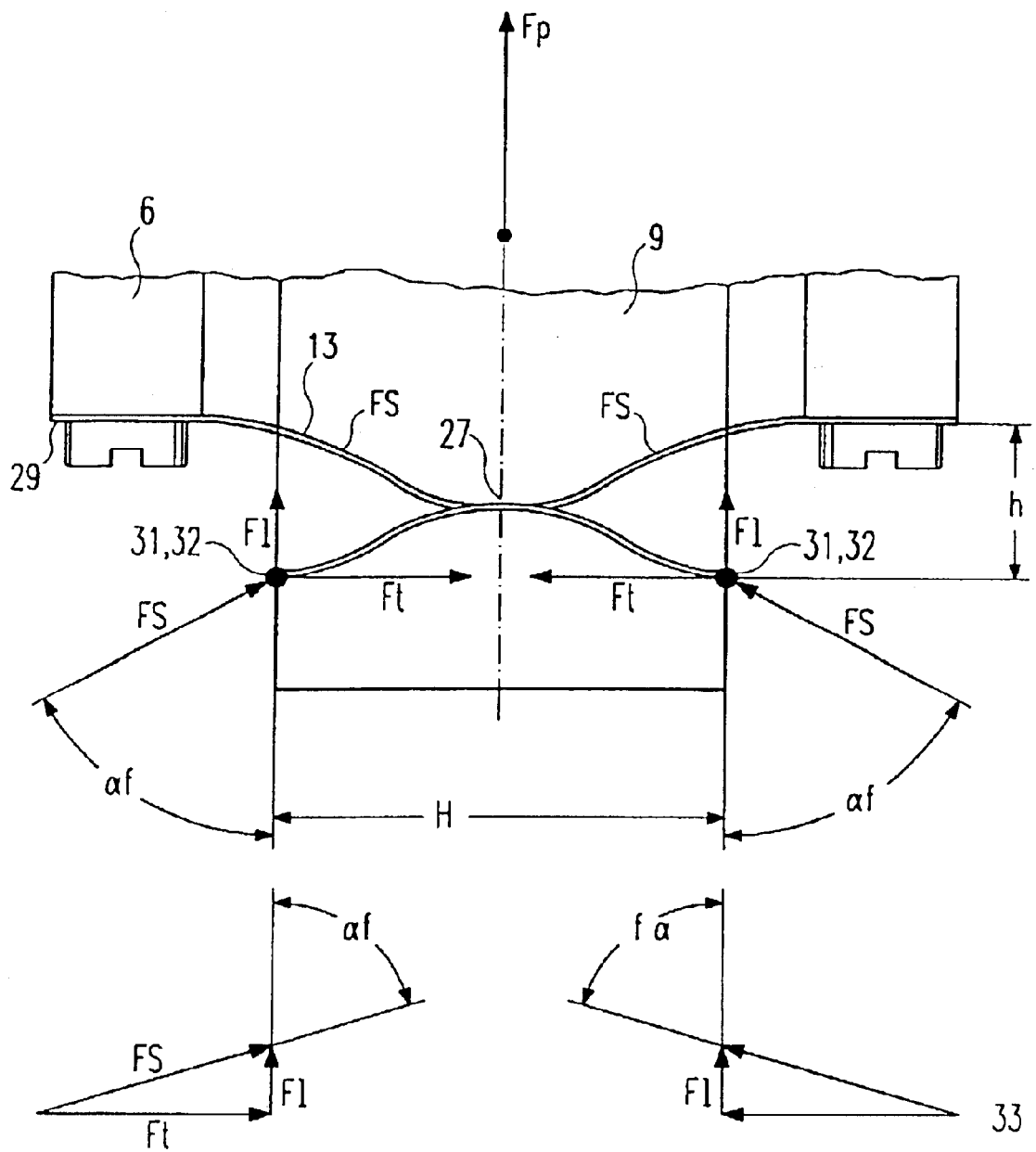
FIG. 8 shows a diagram of the resultant forces which occur on the elastic double frame during operation of the motor.

In summary, FIG. 8 shows the force-induced effects produced in double frame 13 of the holding device. Forces FS are the elasticity forces of plate-like double frames 13, which are directed along frames 13 and act on the longitudinal narrow sides of plate-like piezotransducer 9 at the angle $\alpha f$. Each of the forces Ft is resolved into two forces, namely into the force F1, which is directed perpendicular to friction surface 2 of rotor 1, and force Ft, which is directed perpendicular to the longitudinal narrow sides of piezotransducer 9. The sum of the forces F1 forms the pressing force Fp, which presses friction element 12 against friction surface 2. The pair of forces Ft compresses transducer 9 and fixes it.

Figure 9:
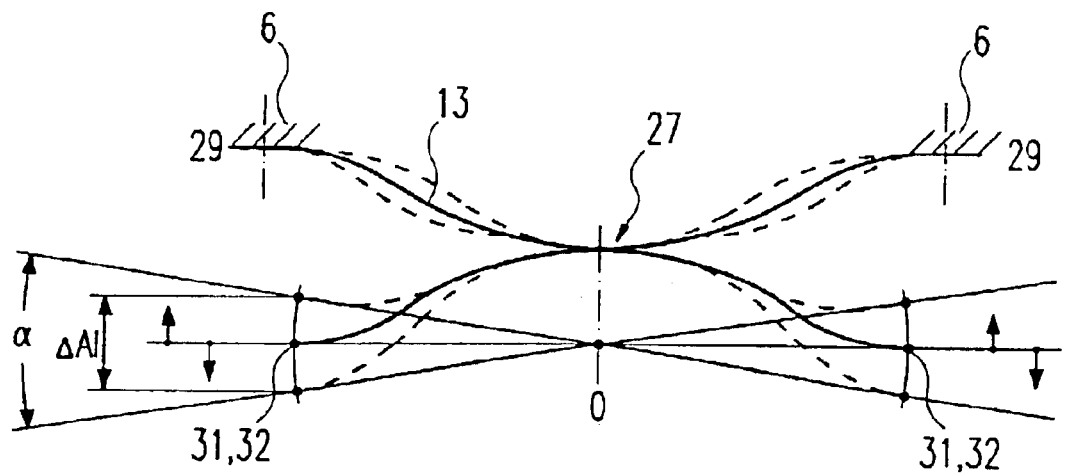
FIGS. 9 and 10 show diagrams of forms of oscillation of the faces of the elastic double frame.
Figure 10:
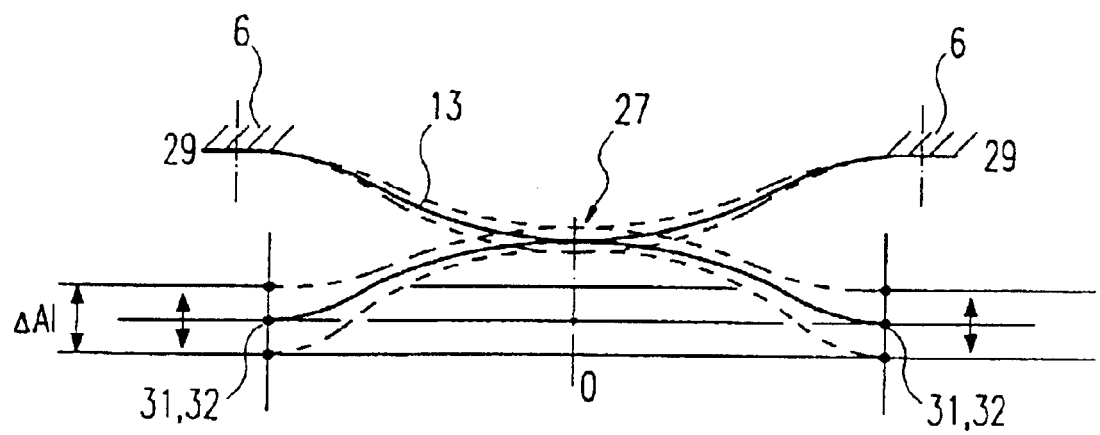

Various oscillation forms are additionally shown in FIGS. 9 and 10, the oscillations according to FIG. 9 being due to the influence of the bending mode and the oscillations according to FIG. 10 being due to that of the longitudinal mode of the exciter.

The friction element for the piezoelectric drive for transmitting forces between stator and rotor has already been mentioned in the foregoing description of the practical example. This friction element is provided here with a double-layer structure, wherein the part of the layer structure bonded to the transducer is formed as a hard, porous member and the part of the layer structure in contact with the rotor is formed as an abrasion-resistant monolithic member, the two layers being firmly bonded to one another by sintering. Fillers to achieve a firm bond between the transducer surface on the one hand and the friction element on the other hand are disposed in or introduced into the pores of the part of the layer structure bonded to the transducer. Examples of these fillers are epoxy resin and/or low-melting glasses.

Figure 11:
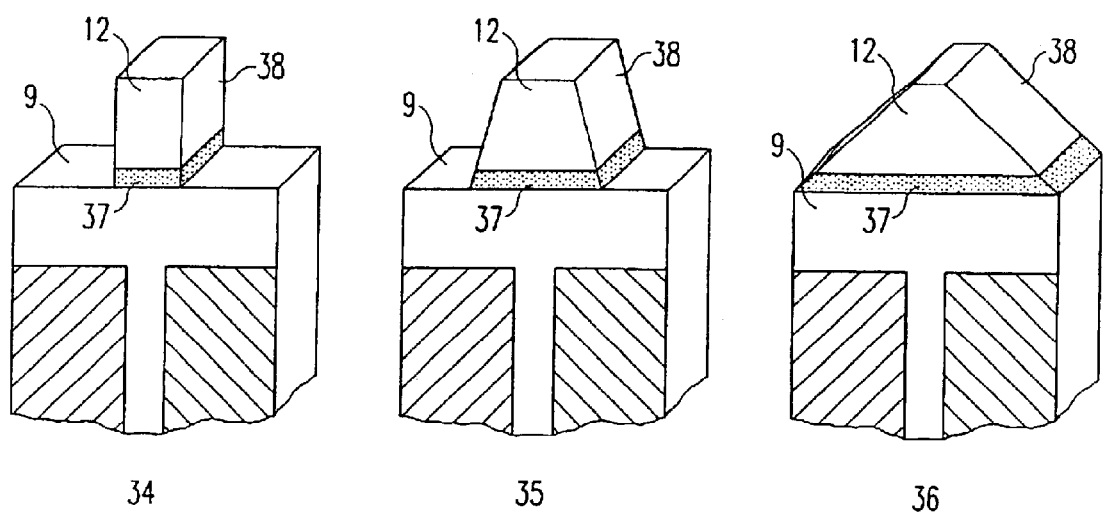
FIG. 11 shows different alternative embodiments with respect to the geometric layout of the friction element.

Alternative embodiments of the friction layer with double-layer structure are presented in FIG. 11. Diagram 34 shows a rectangular, diagram 35 a trapezoidal or truncated pyramidal and diagram 36 a conical friction element 12.

The illustrated friction elements 12 have the cited double-layer structure, which in this case is disposed parallel to the end surface of piezoelectric transducer 9. Layer 37, which is bonded to the surface of piezoelectric transducer 9, is formed as the cited hard but porous member, while layer 38, which comes into contact with friction surface 4 of rotor 1, is made of a hard, abrasion-resistant monolithic material. Aluminum oxide, zirconium oxide or similar materials can be used as the material for the rotor.

In the circuit arrangement according to the practical example for operation of a piezoelectric drive, especially a piezoelectric motor, wherein the drive is constructed as a piezoelectric exciter from a monolithic plate-like piezoelectric transducer with substantially rectangular electrode faces and the electrode faces are disposed on the front and rear sides of the longitudinal sides of the transducer, there is used a primary or control generator, which is connected directly to a first input of a two-channel bridge power amplifier and, via a phase shifter, indirectly to the second input of the power amplifier. The outputs of the bridge power amplifier are routed via a filter to the primary side of a summing transformer, the secondary side of the transformer being connected on the one hand to the rear electrode and on the other hand, via a changeover switch, to one or the other of the pairs of front-side electrodes. The filter used is an L-C arrangement connected in series.

Figure 12:
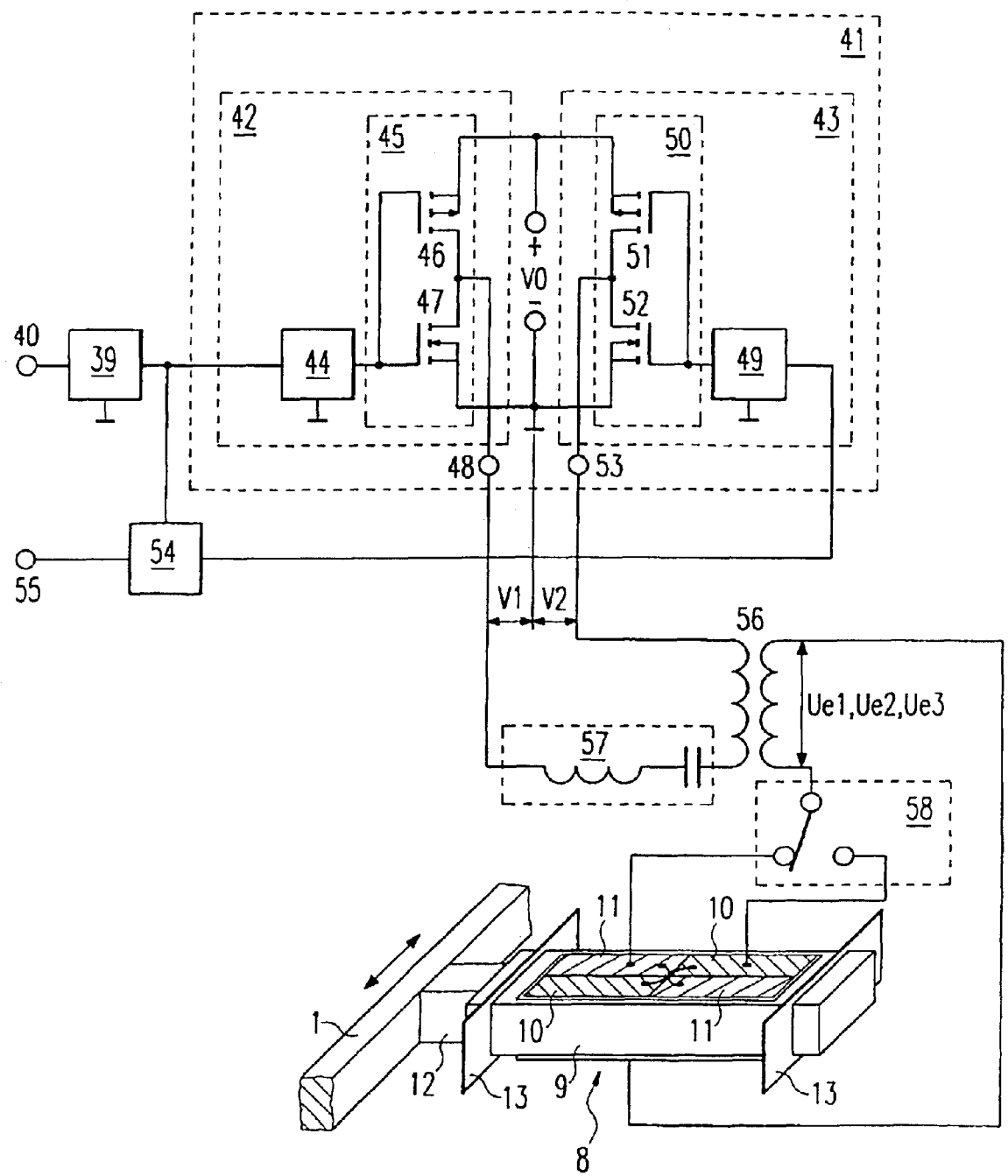
FIG. 12 shows an embodiment of the circuit arrangement for operation of a piezoelectric drive, including a block diagram of the transducer with double-frame holding device.

A first alternative embodiment of the circuit arrangement will be described with reference to FIG. 12. The circuit arrangement, which in FIG. 1 is denoted by 15, comprises a primary or control generator 39 with a frequency-controlling input 40, and a bridge power amplifier 41 with a first channel 42, a second channel 43 and a voltage source V0 (not illustrated).

First channel 42 comprises a driver module 44 and the one half of power amplifier 45 with switch transistors (FET) 51, 52 and output junction 53.

The input of first channel 42 of the power amplifier is connected directly to the output of primary generator 39 and the input of second channel 43 is connected via phase shifter 54 to the output of primary or control generator 39. Furthermore, phase shifter 54 has a control input 55.

The cited summing element of transformer 56 and an L-C serial element as filter 57 are looped into the diagonals of bridge power amplifier 41, or in other words at outputs 48 and 53. The secondary winding of transformer 54 is connected via changeover switch 58 to one or the other of the electrode groups 10, 11 of piezoelectric transducer 9.

Figure 13:
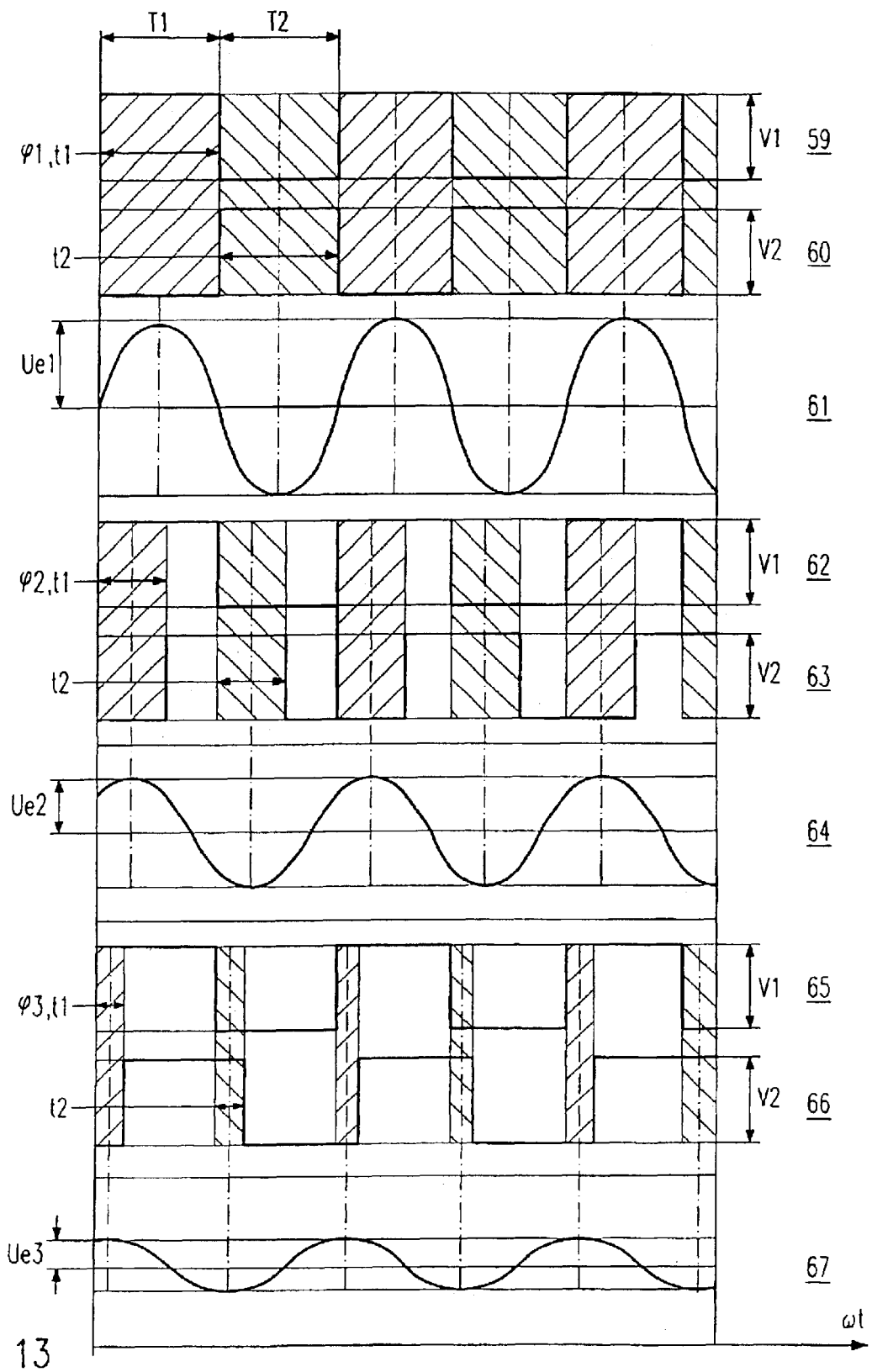
FIG. 13 shows a diagram of the excitation behavior in association with the variation of substantially sinusoidal activating voltages.

FIG. 13 shows explanatory voltage variation diagrams for an understanding of the motor operation. Voltage variations V1 shown in diagrams 59, 62 and 65 occur at output 48 of bridge power amplifier 45. The variations according to diagrams 60, 63 and 66 show the voltages V2 at output 53 of bridge power amplifier 50. Diagrams 61, 64 and 67 relate to the voltages Ue1, Ue2, Ue3 at different phase shifts $\phi 1$, $\phi 2$ and $\phi 3$ between voltages V1 and V2. The times t1 and t2 correspond to the connection times of voltage source V0 to the primary winding of summing transformer 56 for the first half period T1 and the second half period T2.

Figure 14:
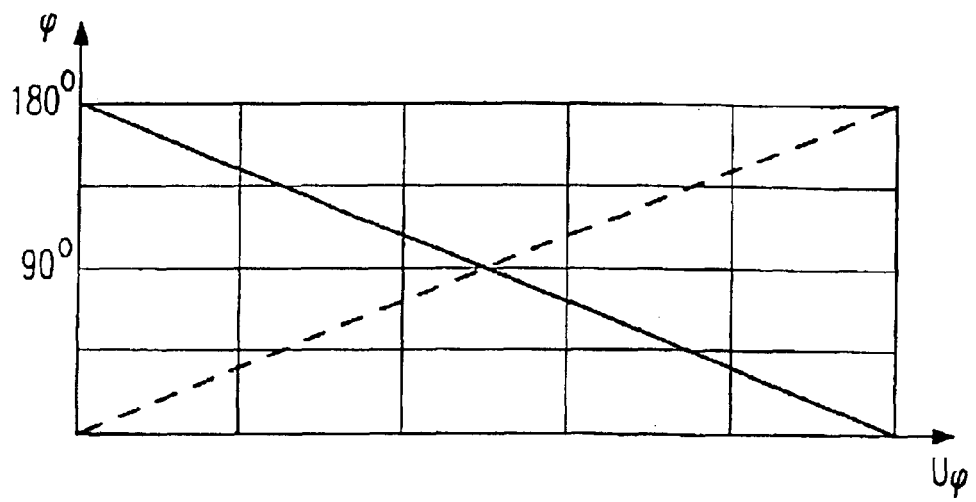
FIG. 14 shows explanatory diagrams with respect to the operating principle of the circuit arrangement.
Figure 14:
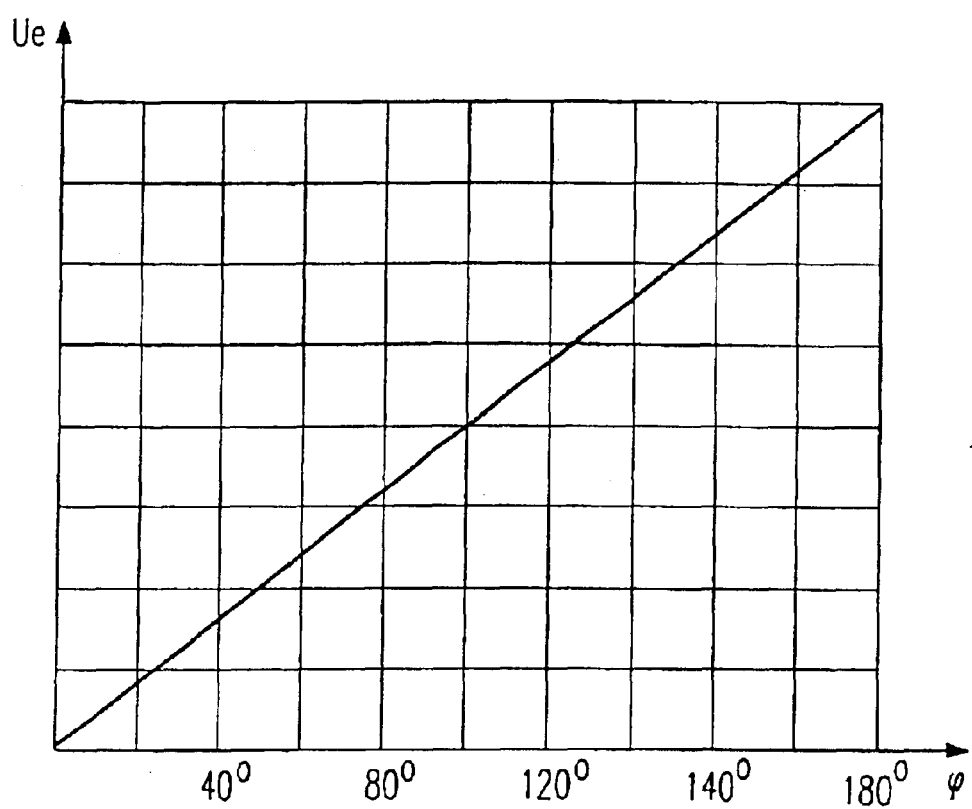

The working principle of the part of the circuit arrangement for driving the motor explained in FIG. 12 will be explained with reference to FIG. 14. Diagram 68 shows how the phase-shift angle $\phi$ of phase shifter 54 between its input and output signals depends on the voltage UV at control input 55. Diagram 69 shows the dependence between the phase-shift angle $\phi$ and the voltage Ue at the secondary winding of summing transformer 56.

Figure 15:
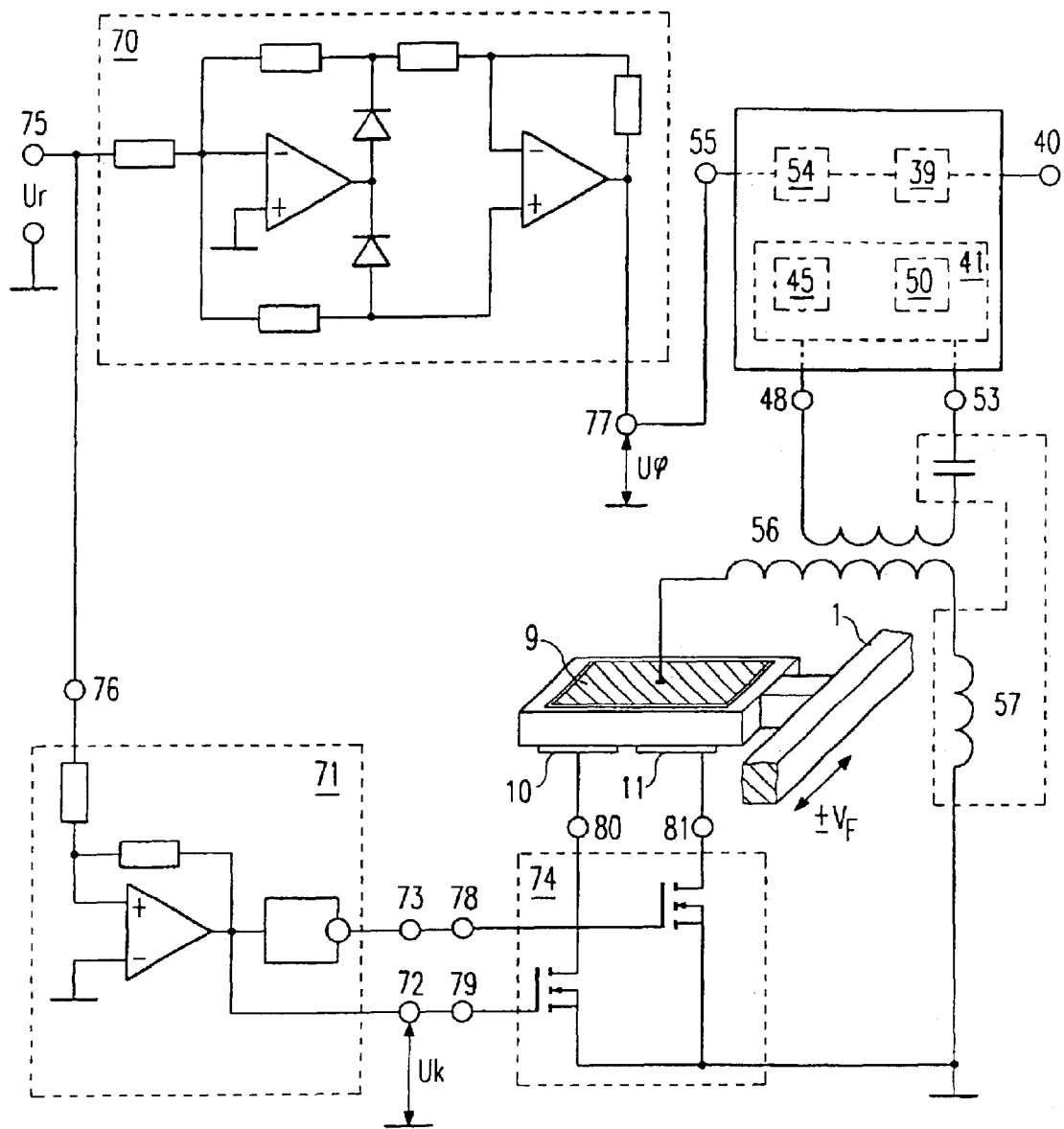
FIG. 15 shows a further embodiment of the circuit arrangement for operation of a piezoelectric drive with signal-level transducer.

In the further embodiment of the circuit for operation of a piezoelectric drive according to FIG. 15, there is additionally provided a signal-level transducer 70, a comparator 71 with noninverting input 72 and inverting input 73, and an electronic electrode-group commutator 74.

Input 75 of signal-level transducer 70 is connected to comparator input 76. Output 77 of signal-level transducer 70 is connected to input 55 of phase shifter 54. Comparator outputs 72, 73 are connected to inputs 78, 79 of the electrode-group commutator, the commutating terminals 80, 81 of which are routed to the two electrode groups 10, 11.

Figure 16:
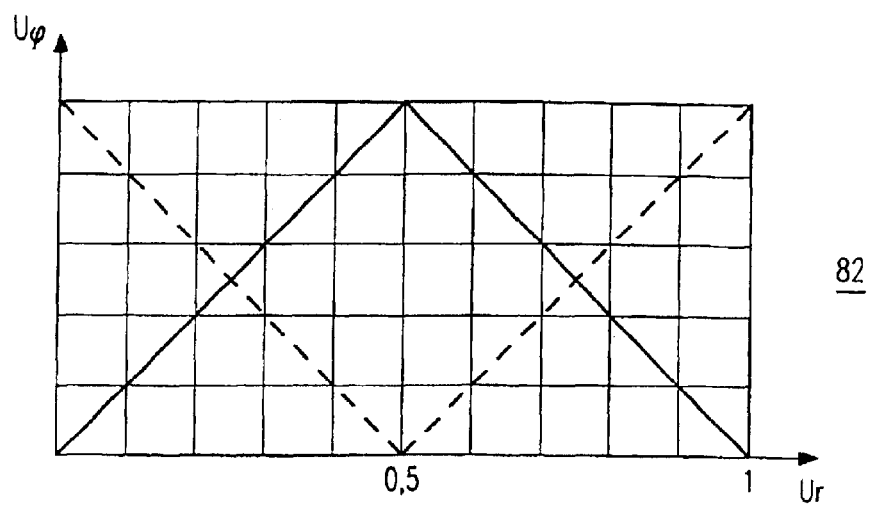
FIG. 16 shows explanatory diagrams with respect to the operating principle of the circuit arrangement according to a practical example.
Figure 16:
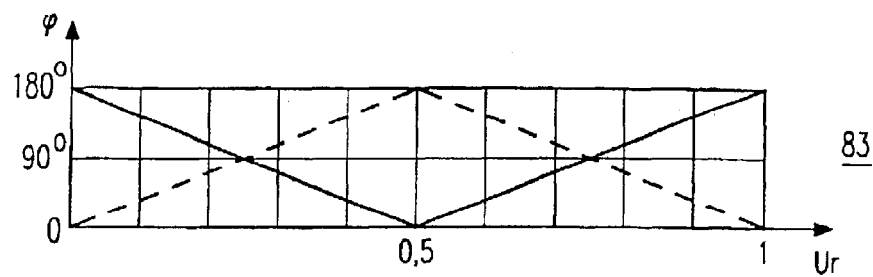
Figure 16:
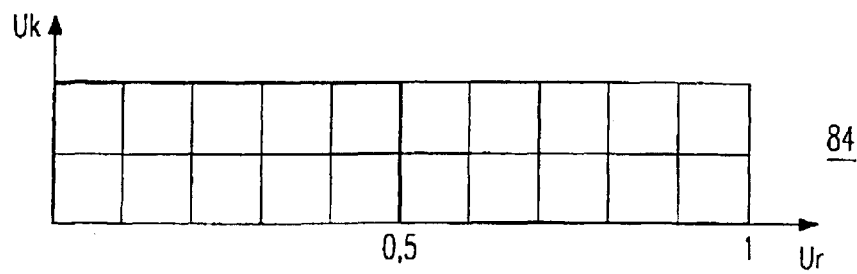
Figure 16:
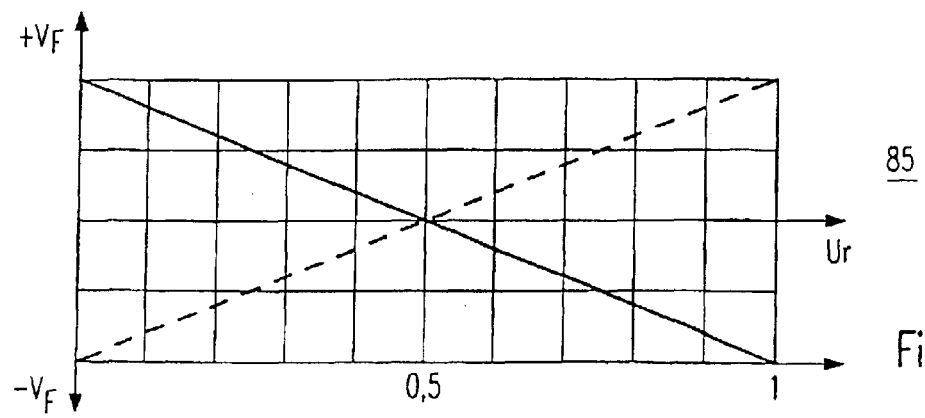

Referring now to FIG. 16 and the diagrams shown therein, diagram 82 shows a special dependence of the voltage U$\phi$ present at output 77 of signal-level transducer 70 on the voltage Ur present at output 75. Diagram 83 shows how the phase-shift angle $\phi$ at the input and output of phase shifter 54 depends on voltage Ur. Diagram 84 discloses the dependence of the voltage Uk at noninverting comparator input 72 on voltage Ur. The dependence of the velocity of movement of rotor 1 on the voltage Ur is clearly evident from diagram 85.

Figure 17:
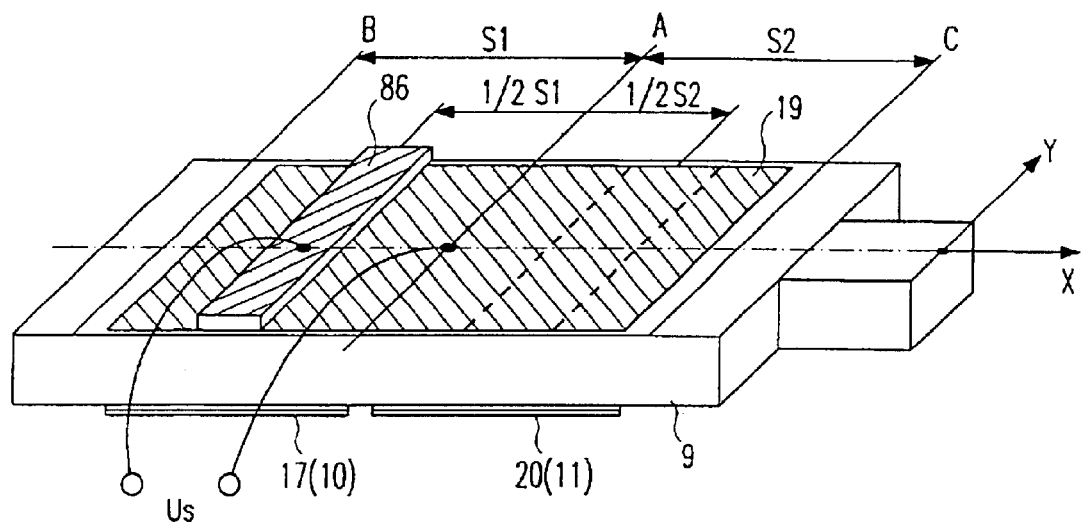
FIG. 17 shows a diagram of the basic design and arrangement of the bending sensor for determination of the bending components of the mechanical exciter oscillations.
Figure 17:
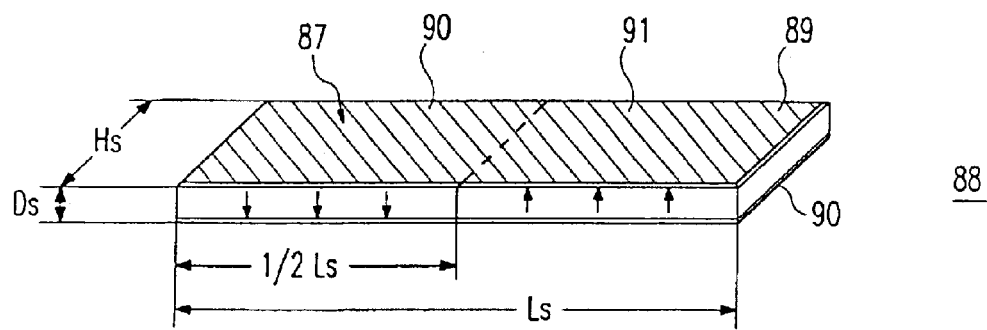

According to the diagram of FIG. 17, the possibility exists of disposing on plate-like piezoelectric transducer 9 a bending sensor 86, which detects mechanical bending oscillations of exciter 8. Sensor 86 is designed as a thin piezoelectric plate with length Ls, height Hs and thickness Ds as plate 87. Diagram 88 shows the sensor in side view.

Electrodes 89 and 90 are disposed on the two main sides of the piezoelectric plate of the sensor. Plate 87 has two parts 90 and 91 of equal length, in which the piezoceramic is polarized in two opposite directions, perpendicular to electrodes 88 and 89. The polarization is indicated symbolically with the arrow diagrams.

The dimensions of plate 87 of sensor 86 are determined by the dimensions of plate-like piezoelectric transducer 9 of the actual exciter. The plate length Ls should be equal to the width of the transducer, while the width Hs ranges between 0.02 to 0.2 times the length L. The thickness Ds should be minimized to the extent technologically possible. Typically the thickness Ds ranges between 0.1 and 0.3 mm.

On the surface of plate-like piezoelectric transducer 9, plate 87 of sensor 86 is joined thereto, specifically on lower electrode (rear-side electrode) 19, where it is disposed midway between the middle node of the bending mode of the oscillations and one of the side nodes, or in other words midway between lines A and B or A and C, such that it runs perpendicular to the longitudinal narrow sides of the piezotransducer. Sensor 86 can be fastened to the surface of transducer 9 by adhesive bonding using epoxy resin or by soldering with a soft solder.

Figure 18:
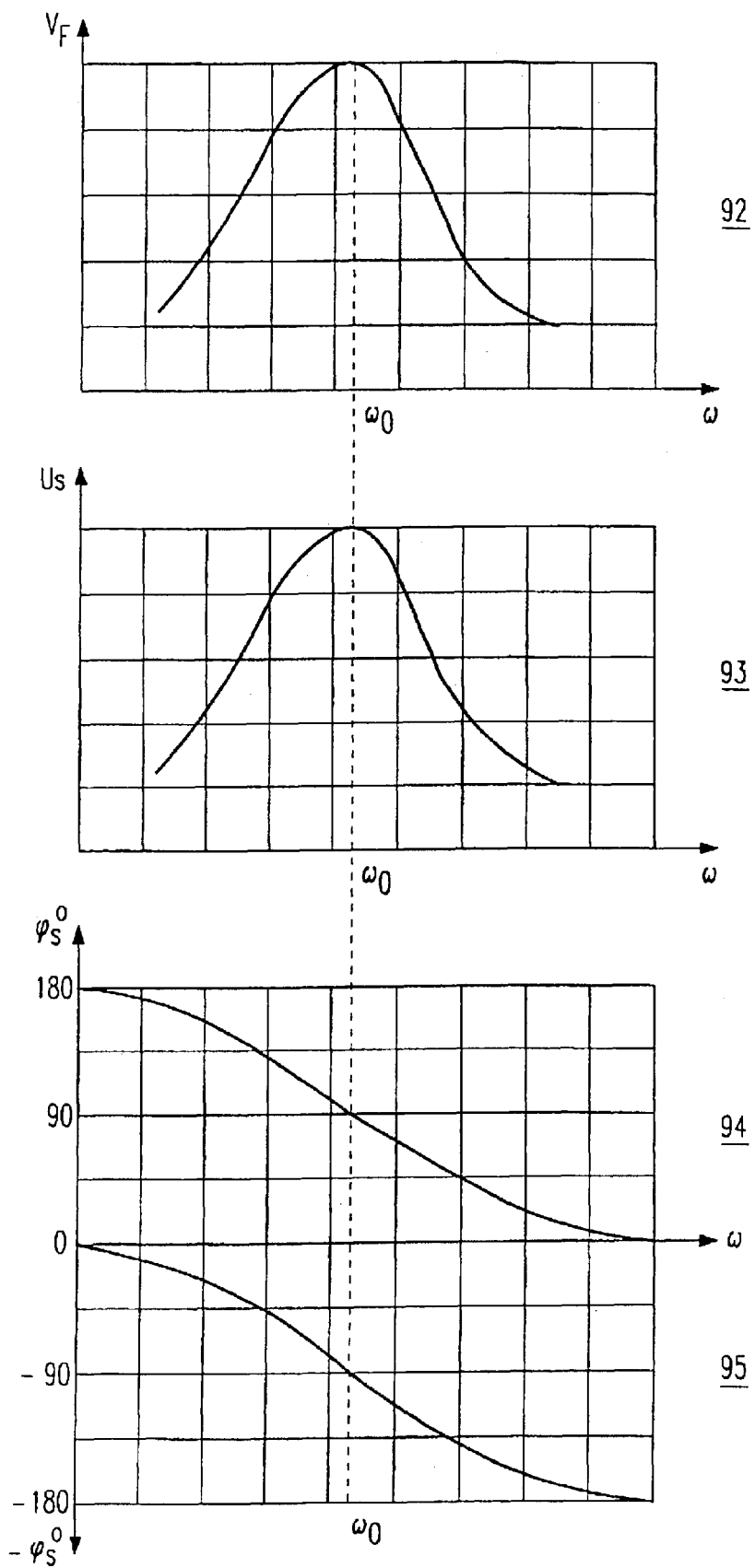
FIG. 18 shows explanatory diagrams with respect to the working principle of the bending sensor.

The operating principle of bending sensor 86 as regards the mechanical bending stresses to be detected is illustrated in FIG. 18. Diagram 92 shows the dependence of the velocity Vf of movement of rotor 1 on the angular frequency ω of primary generator 39. The angular frequency ω0 corresponds to the maximum velocity of rotor 1. The dependence of the voltage Us present at electrodes 89, 90 of sensor 87 on the angular frequency ω of primary generator 39 is shown in diagram 93, while diagrams 94 and 95 symbolize frequency dependences of the phase shift of voltage Us and of voltage Ue at one of the electrode groups.

Figure 19:
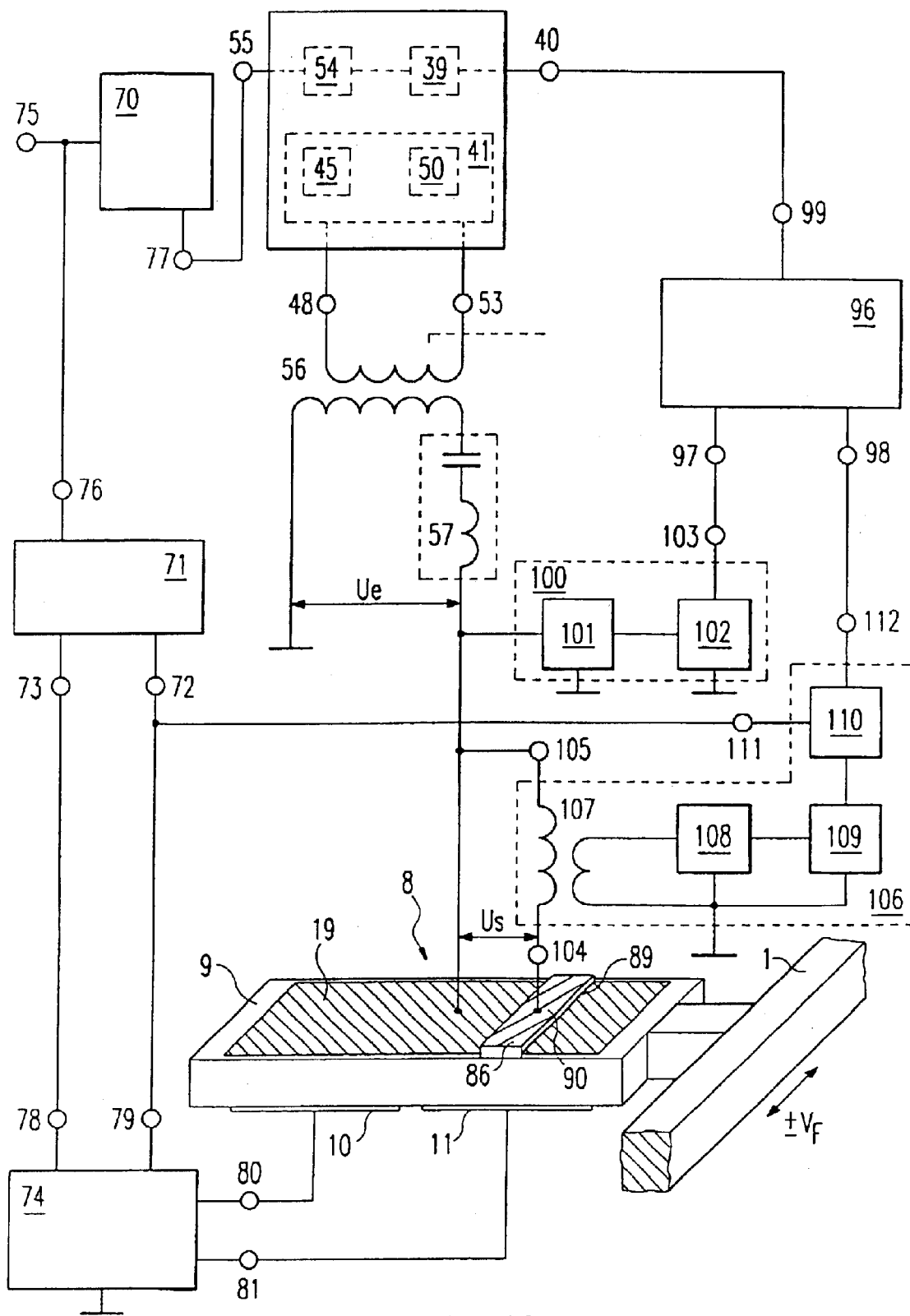
FIG. 19 shows a further alternative embodiment of the circuit for activation of a piezoelectric drive with piezoelectric transducer as bending sensor, for the purpose of stabilizing motor operation in a broad temperature range.

As shown in the block diagram of FIG. 19, the output signals of bending sensor 86 are linked into the circuit arrangement for control and operation of a piezoelectric drive. In addition, phase detector 96 is provided in this case with phase-support input 97, phase-control input 98 and control-signal output 99.

Electrode 90 of one of the electrode groups 10 or 11 is connected to support-signal generator 100, which comprises a signal limiter 101 as well as a comparator 102. Output 103 of support-signal generator 100 is connected to input 97 of phase detector 96. Electrodes 90, 89 of bending sensor 86 are connected to inputs 104, 105 of control-signal generator 106. The control-signal generator further comprises an isolating transformer 107, a filter 108, a comparator 109 and a control inverter 110 with control input 111. Output 112 of control-signal generator 106 is connected to control-signal input 98 of phase detector 96.

The operating principle of the circuits described in the foregoing is as follows. Upon startup a voltage is produced whose frequency ω is equal to the resonance frequency of the mechanical resonator in the second mode of the bending oscillations of exciter 8. This voltage is supplied via leads 16 to one of the electrode groups 10 or 11 of plate-like piezoelectric transducer 9. Electrode group 10 is formed by the two upper electrodes 17, 18, which are electrically connected to one another, and by lower electrode 19 (see FIG. 2).

Electrode group 11 results from the two upper electrodes 20 and 21, which are electrically connected to one another, and from lower electrode 19. The electric voltage of circuit arrangement 15 is fed either to electrodes 17, 18 and 19 or to electrodes 20, 21 and 19.

Length L and width H of plate-like piezoelectric transducer 9 are chosen such that the mechanical resonance frequencies of the second bending mode and of the first longitudinal mode of the oscillations of the exciter are close to one another. Usually the resonance frequency of the longitudinal oscillations is higher by a given amount than the resonance frequency of the bending oscillations, and so an L:H ratio of approximately 3:7 is chosen for the illustrated example.

By the fact that electrodes 17, 18 and 20, 21 are connected diagonally relative to the longitudinal axis of the plate-like exciter, the action of the applied voltage is unsymmetric. As a result, bending and longitudinal oscillations are simultaneously produced in the exciter. Since the amplitude of these oscillations is small compared with the size of the exciter, these oscillations can be considered independently of one another.

According to diagram 22 in FIG. 2, the bending deformation of exciter 8 leads to a distribution of transverse oscillation velocities Vy along oscillator length L. Diagram 23 in FIG. 2 discloses the distribution of longitudinal oscillation velocities Vx produced by the longitudinal deformations of the exciter. Because of the mutual superposition of oscillations, friction element 12 of exciter 8 performs elliptical movements in the x-y plane. By means of friction element 12, which is pressed compliantly against the friction surface of the rotor, these elliptical movements are transferred to the rotor, leading to the desired movements thereof.

On the smaller side surfaces of the plate-like transducer, or in other words the longitudinal narrow sides, there are located three nodes of the oscillation velocities Vy at which the oscillation velocity Vy is equal to zero. The oscillation nodes in question are located on lines A, B and C (see diagram 23 in FIG. 2). In other words, three points at which no transverse components of the oscillation velocity Vy exist are located on each of the longitudinal narrow sides of the plate-like piezoelectric transducer. Accordingly, the points denoted by reference symbols 24 in the vicinity of lines B and C are preferably suitable for undertaking fastening of the plate-like piezoelectric transducer from the viewpoint of the static and dynamic loads imposed on the rotor.

The special holding device with double frames, or in other words the fixture for transverse fastening and for pressing, is designed such that it is absolutely elastic in transverse direction X for the dynamic forces which act with frequency ω0 due to the piezoceramic transducer.

For the static force acting along longitudinal axis X, the fixture functions as an elastic spring, which produces the force necessary to press friction element 12 against friction surface 2 of the rotor. Along axis Y, no dynamic forces are produced by the piezoelectric transducer with frequency ω0, since no components of the oscillation velocity Vy exist. The holding device is therefore rigid for the forces which act in the transverse direction along the Y-axis.

The structure of the double frames is described in the foregoing with reference to FIGS. 1 to 6.

In the functioning condition of the motor, static secondary forces Fp directed along the X-axis and perpendicular to friction surface 2 of rotor 1 act on housing 6, as illustrated by means of FIG. 7. Under these conditions friction element 12 is braced against friction surface 2, and double frames 13 are pulled apart to small equal distances h, which are determined by the elasticity of the double frames and by the resultant force 2Fp.

The resultant force 2Fp is chosen such that it is equal to the static force with which friction element 12 is pressed against friction surface 2 of rotor 1. Thereafter housing 6 is fastened to carrier base 4 by means of screws 7. Once the housing has been fixed in this way, force 2Fp is developed due to the elasticity and spring action of double frames 13, whereupon the secondary forces 2Fp can be canceled.

If, for example, the dimensions of the plate-like piezoelectric transducer are 37×10×3 mm and of the friction element are 3×3×4 mm, the static force 2Fp which presses friction element 12 against friction surface 2 has a magnitude of 10 N. If the double-frame thickness is 0.3 mm and the dimensions of the double frame are substantially 22×6 mm, the force of 10 N is developed when the double frame has been pulled apart to a distance h=0.5 mm.

As is evident from the triangle of forces in diagram 33 of FIG. 8, two static compressive forces Ft, which act perpendicular to the smaller side surfaces of the plate-like piezotransducer and which are much larger than the actual pressing force 2Fp are developed due to the special double-frame configuration and the action of the static pressing force 2Fp. Such resolution of forces or transformation of forces increases, as explained, the reliability of bonding of the double-frame spring arrangement with piezotransducer 9.

Returning to FIGS. 9 and 10, there are illustrated forms of oscillation of double frames 13 which are established due to the bending and longitudinal modes of the oscillations of the exciter. The lateral parts of the outer frames are joined firmly to housing 6 and do not oscillate. The bending modes of the oscillations cause sides 31 of inner frame 26 to turn by a small angle α around point 0. Under these conditions the oscillations have an amplitude ΔAb. The amplitude ΔAb is small and, for a piezolength of L=37 mm, amounts to about 0.01 to 0.5 μm. In FIG. 9 the oscillations of the double frames are represented by a dashed line. Inner frames 26 each turn around the stay or the respective bridge 27.

The longitudinal vibration mode leads to transverse shifting of inner-frame sides 31, the oscillation amplitude in this case being about 3 to 6 μm (see FIG. 10). In FIG. 10, the form of oscillation of double frame 13 is also shown clearly by a dashed line. Inner frame 26 and part of outer frame 25 move symmetrically during oscillation, specifically with respect to the fastened sides 29 of outer frame 25.

In both cases mentioned in the foregoing, the oscillations of the transducer cause bending movements of the double frames. The transducer and the double frames joined thereto act as an oscillating system, the frames introducing into the system a small reactive component and almost no active component, since the frames are made of a material having high mechanical quality. For example, the mechanical quality of heat-treated steel or beryllium bronze exceeds 2000.

Accordingly, the holding device according to the invention simultaneously performs two different functions. In other words, the exciter is fixed in transverse direction and simultaneously the friction element is pressed against the friction surface of the rotor.

By the fact that the piezoelectric motor described in the foregoing has very small internal losses, very high translational velocities of the rotor can he achieved, values greater than 1 to 1.5 m/s being conceivable here.

For transmission of the frictional forces, the inventive friction element has a double structure, in order to ensure a high-quality bond between friction element and piezoceramic surface, and on the other hand in order to achieve adequate long-term stability, especially against abrasion at the friction surface.

To join the friction element having the inventive double structure to the piezoceramic surface, there is used an adhesive that ensures optimal quality of bonding to the ceramic, special types of epoxy resin or low-melting glasses being suggested here. During adhesive bonding of the two-layer friction element, the pores of the porous lower layer are filled with an adhesive, and so the desired secure bond is obtained.

As regards the circuit arrangement, primary or control generator 39 generates a periodic electrical oscillation with a frequency equal to the mechanical resonance frequency ω0 of the bending mode. This voltage is present, on the one hand, directly at the input of the first channel of the bridge power amplifier and, on the other hand, at a phase shifter. The output of the phase shifter is connected to the input of the second channel of the bridge power amplifier. Both channels of the power amplifier have drivers which generate a square-wave voltage at the gate electrodes of the field-effect transistors, and so square-wave symmetric voltages V1, V2 are always present at the outputs of the half-bridge amplifier. The phase shifter shifts the voltage arriving at its input from primary generator 39 by an angle ϕ. The angle ϕ is determined by the control voltage Uϕ present at the input of the phase shifter. The dependence between the phase shift and the control voltage Uϕ is illustrated in diagram 68 of FIG. 14. This dependence can also vary as shown by the dashed line.

The control voltage Uϕ present at the control input of the phase shifter changes the phase shift ϕ between the voltages V1 and V2 present in the branches of the bridge power amplifier. The summing transformer is connected to the output side of the bridge power amplifier.

In the case of change of the phase shift between voltages V1 and V2, changes occur in the times t1 and t2 of conduction through the switching transistors of the bridge power amplifier and through the summing transformer, which is connected to V0 in both voltage directions. Transistors 46 and 52 are open during time t1, and transistors 47 and 50 are open during time t2. The tappable voltage (outputs 48 and 53) present in the diagonals of bridge power amplifier 41 has square-wave form and has a duration t1 and t2 which depends on the angle ϕ. During the times (T1–t1 and T2–t2), outputs 48 and 53 of the bridge power amplifier are connected, in the first case via transistors 47 and 52, and in the second case via transistors 46 and 52.

Because of LC band-pass filter 57 connected in series with the primary winding of the summing transformer, practically only the current of the first harmonic of the voltage present at outputs 48 and 53 flows through the transformer. As a result, the voltage Ue present at the secondary winding of the summing transformer has a sinusoidal variation. The amplitude of this voltage (Ue1, Ue2, Ue3) depends on the duration t1 and t2 and also has a dependence on the phase shift ϕ (ϕ1, ϕ2, ϕ3) between the voltages V1 and V2. This dependence is illustrated in diagram 69 of FIG. 14.

The phase-shift angle ϕ changes due to the changed control voltage Uϕ present at input 55 of phase shifter 54. Hereby the voltage Ue at the secondary winding of the summing transformer also depends on the voltage Uϕ. The voltage Ue excites the piezoelectric transducer. The amplitude of the voltage Ue then determines the amplitude of oscillation of the transducer. During changes of the voltage Uϕ, the velocity of rotor 1 also changes.

The piezoelectric motor that can be activated with the described circuit arrangement therefore permits control of the rotor velocity by changing the control voltage Uϕ present at the control input of the phase shifter. Motor control can then be achieved almost without energy loss, since the output transistors of power amplifier 41 are always in switched mode of operation.

The voltage Ue is applied to electrode groups 10 or 11, changeover being possible by means of the corresponding switch 58. The direction of movement of the rotor can be changed by changeover.

As explained by means of FIG. 15, it is possible in one embodiment of the control circuit to predetermine the rotor velocity and direction by unipolar control voltages Ur. For this purpose there are additionally provided the signal-level transducer, comparator and electrode-group commutator.

At a control voltage of 0.5 Ur, the rotor is in braked condition, whereas, at a voltage in the region of 0 or Ur, movement with maximum velocity takes place. The dependence of the output voltage of the signal-level transducer on the input voltage Ur is shown with diagram 28 of FIG. 16. During an increase of control voltage Ur, the output voltage Uϕ also increases linearly, reaching the maximum value at a voltage of 0.5 Ur. With further increase of the voltage Ur, the voltage Uϕ decreases linearly. Since the voltage Uϕ reaches the control input of the phase shifter, the increase of Ur first of all leads to reduction of the phase-shift angle and then to an increase thereof, as is clearly illustrated in diagram 83 of FIG. 16.

Between the voltage values 0.5 Ur and 0, the comparator is in a first state. The logical value 1 is then present at its noninverting output 72 and the logical value 0 at inverting output 73. In such a state of comparator 71, output 80 of the electronic commutator is closed and output 81 is open, while the rotor is moving with velocity Vf. The point 0.5 Ur is the point of reversal of the movement of the rotor. Upon passage through this point 0.5 Ur, comparator 71 changes over, leading to inversion of the signals at outputs 72 and 73 and at inputs 78 and 79 of electrode-group commutator 74. The latter leads to a change of state of commutator 74. Its output 80 is now opened and output 82 is closed. Herewith the rotor now changes its direction of movement. A further decrease of the voltage Ur causes an increase of the phase-shift angle ϕ and an increase of the velocity Vf of the rotor.

During operation of piezoelectric motors in a broad temperature range, a temperature-induced shift of the mechanical resonance frequency takes place. This effect becomes more pronounced the greater the oscillator quality is, or in other words the smaller its mechanical losses are. The temperature shift of the resonance frequency prevents stable motor operation. In order to avoid this effect, in an embodiment of the motor that has been explained, the exciter frequency of the primary generator follows the temperature changes of the resonance frequency of the bending oscillation mode of the piezoelectric exciter. In this case the mechanical bending component of the stresses is determined by means of a bending sensor, and a corresponding sensor signal is derived and supplied to a feedback branch.

The flat plate-like structure of the sensor with bidirectional polarization makes it possible to select a component of an electrical voltage Us that is proportional to the component of the mechanical exciter, and which in turn is proportional to the velocity of oscillation of the bending mode of the exciter.

The bending deflection or deformation of the plate-like transducer along the X-axis in the XY plane leads to compression of one half of bending-sensor plate 87 and to pulling apart of the other half 90 or 91 of sensor 86. In such a sensor construction, the stresses produced by each plate half 90 and 91 are equally large and unipolar as well as proportional to the mechanical exciter stresses. The longitudinal deformation of plate 87 as a consequence of the longitudinal oscillation mode acting on sensor 86 leads to compression and pulling apart of halves 90 and 91, and so equal stresses of opposite sign are produced that compensate for one another.

The dependence of the rotor velocity vf and of the voltage amplitude Us at electrodes 89 and 90 of sensor 86 on the exciter frequency ω is illustrated in diagrams 92 and 93 of FIG. 18. These dependences mirror one another, and the velocity maximum vf corresponds to the voltage maximum Us. Both maxima are located at the point of the mechanical resonance frequency of the bending oscillation mode ω0.

Diagrams 94 and 95 illustrate how the phase-shift angle ϕf depends on the exciter voltage Ue at one electrode group, and on the other hand show the voltage Uf established at electrodes 89 and 90 of sensor 86. The phase-shift angle ϕs=90° corresponds to the maximum value of the movement velocity Vs. When the electrode groups are changed over from group 10 to group 11, the phase-shift angle ϕs changes to 180°, or in other words to −90°. The dependence of phase-shift angle ϕs on exciter frequency ω illustrated in diagram 95 of FIG. 18 extends over a broad temperature range, and this dependence is used as a form of feedback in order to correct the primary generator as a function of temperature changes and of the changed resonance frequency.

The feedback branch necessary for this purpose includes sensor 86 and phase detector 96. The additionally present phase detector generates an error signal that is proportional to the phase difference ϕf between the voltages at its support input 97 and at the control input 98 relative to a value of 90° or any other predesignated value. The error signal is relayed by output 99 to control input 40 of primary generator 39, whereby its exciter frequency is changed such that the phase difference always remains equal to a predesignated value ϕs.

The voltage Ue at one of the electrode groups 10 or 11 is used as the support signal. This voltage is limited by limiter 101 and reshaped by comparator 102. In this case the control signal is the voltage Us present at sensor electrodes 89 and 90. The voltage Us is first delivered to isolating transformer 107, after which the first harmonic is filtered out by means of a filter 108 and the signal is reshaped to square-wave form via comparator 109. Comparator 109 is connected to controlled inverter 110, whose control input is connected to one of the comparator outputs 72 or 73. Controlled inverter 110 rotates the phase of the control signal by 180° depending on whether electrode group 10 or 11 is selected. Thereafter the signal is relayed by output 112 of inverter 110 to control input 98 of phase detector 96.

With the circuit described in the foregoing, the resonance frequency of the primary generator can be kept equal to the mechanical resonance frequency of the exciter over a broad temperature range, and so motor operation with high precision can be achieved almost independently of temperature.

The presented piezoelectric drive, especially piezoelectric motor, has low mechanical losses due to the special holding device by means of double frames. The losses can be estimated by the effective quality of the unloaded exciter, or in other words in the absence of contact with the rotor in the operating situation. The measured quality of the unloaded exciter ranges between 500 and 700. Accordingly, typical effective values approximately ten times better than those of known motors can be achieved. In the proposed solution, the connecting points between the piezoelectric transducer and the holding device practically do not heat up, and so no additional exciter heating takes place. This also contributes to improved and stable motor operation. The motor therefore has a more favorable energy balance and greater efficiency. The exciter voltage can be as much as three times smaller than in known solutions. Likewise the positioning precision is high, extending into the range of several nanometers, which represents an inherently theoretical limit.

REFERENCE SYMBOLS

1 Rotor
2 Friction surface
3 Bearing
4 Base or carrier
5 Drive element
6 Housing of the drive element
7 Fastening screws of the housing 8 Piezoexciter
9 Plate-like piezoelectric transducer
10, 11 Electrode group
12 Friction element
13 Flat, elastic double frames
14 Fastening screws of the double frame
15 Driver arrangement for the piezoelectric transducer
16 Lead wires
17, 18 Upper electrode
19 Lower electrode
20, 21 Upper electrode
22 Diagram with illustration of the velocities of oscillation of the bending-oscillation mode
23 Diagram of the velocities of oscillation of the longitudinal-oscillation mode
24 Fastening points of the flat elastic double frame
25 Outer frame
26 Inner frame
27 Stay or bridge or middle bridging structure between inner and outer frame
28 Air gap
29 Side of the outer frame
30 Fastening bores in the outer frame
31 Side of the inner frame
32 Adhesive or solder drop
33 Triangle of forces
34–36 Alternative versions of the friction element
37 Porous layer part
38 Monolithic friction-layer part
39 Primary generator
40 Control input of the primary generator
41 Two-channel bridge power amplifier
42 First channel of the bridge power amplifier
43 Second channel of the bridge power amplifier
44 Driver of the first channel
45 Half-bridge of the power amplifier
46 Upper transistor of the power amplifier
47 Lower transistor of the power amplifier
48 Output of the power amplifier
49 Driver of the second channel of the power amplifier
50 Half-bridge of the power amplifier
51 Upper transistor of the power amplifier
52 Lower transistor of the power amplifier
53 Output of the power amplifier
54 Phase shifter
55 Control input of the phase shifter
56 Summing transformer
57 Filter
58 Electrode-group changeover switch
59–67 voltage diagrams
68, 69 Explanatory diagrams relating to the working principle of the circuit arrangement
70 Signal-level transducer
71 Comparator
72 Noninverting comparator output
73 Inverting comparator output
74 Electric electrode-group commutator
75 Control input of the signal-level transducer
76 Comparator output
77 Output of the signal-level transducer
78, 79 Control inputs of the electronic commutator
80, 81 Outputs of the electronic electrode-group commutator
82–85 Explanatory diagrams on the principle of action of the circuit arrangement
86 Bending sensor
87 Piezoelectric sensor plate of the bending sensor
88 Diagram of the piezoelectric plate of the bending sensor
89, 90 Electrodes of the bending sensor
91 Portion of the bending sensor
92–95 Explanations of the action of the bending sensor
96 Phase detector
97 Support-signal input of the phase detector
98 Control input of the phase detector
99 Phase-detector input
100 Support-signal generator
101 Signal limiter
102 Comparator
103 Output of support-signal generator 100
104, 105 Inputs of the control-signal generator
106 Control-signal generator
107 Isolating transformer
108 Filter
109 Comparator
110 Controlled inverter
111 Control input of the inverter
112 Output of the inverter

What is claimed is:

1. A piezoelectric drive, especially a piezoelectric motor for producing continuous or stepwise movements, comprising a rotor provided with a friction surface, a drive element in the form of a piezoelectric exciter that can be brought into contact with this surface, the exciter comprising a monolithic, plate-like, piezoelectric transducer provided with substantially rectangular electrode faces, an outer fastening, a friction element disposed on one of the end faces of the piezoelectric transducer, as well as a holding device for the piezoelectric transducer and means for pressing the friction element elastically against the friction surface, characterized in that an elastic double frame enclosing the transducer and having inner and outer frames is disposed at each outer node of the bending oscillation mode for the purpose of holding the piezoelectric transducer and for producing the pressing force of the friction element, the inner frame being joined to each of the longitudinal narrow sides of the transducer and the outer frame to the outer fastening, and furthermore the outer frame and inner frame being spaced apart and maintained in contact via stays or bridges.

2. A piezoelectric drive according to claim 1, characterized in that the double frame has a structure that is symmetric along its axis, and the centrally disposed stays or bridges join inner and outer frames.

3. A piezoelectric drive according to claim 1, characterized in that two oppositely disposed stays or bridges are provided, and in that a spacing gap is formed between the longitudinal broad sides of the transducer and the inner frame.

4. A piezoelectric drive according to claim 1, characterized in that the double frame is made of a high-quality metal material.

5. A piezoelectric drive according to claim 1, characterized in that the inner frames are each fastened by continuous material to the transducer.

* * * * *

UNITED STATES PATENT AND TRADEMARK OFFICE
CERTIFICATE OF CORRECTION

PATENT NO. : 6,979,934 B1
DATED : December 27, 2005
INVENTOR(S) : Wischnewskiy

It is certified that error appears in the above-identified patent and that said Letters Patent is hereby corrected as shown below:

<u>Title page,</u>
Item [86], should read:
-- [86] PCT No.: PCT/EP00/06133

§ 371 (c)(1),
(2), (4) Date: Apr. 17, 2002 --.

Signed and Sealed this

Twenty-first Day of March, 2006

JON W. DUDAS
*Director of the United States Patent and Trademark Office*